United States Patent
Yamanaka et al.

(10) Patent No.: US 9,080,017 B2
(45) Date of Patent: *Jul. 14, 2015

(54) SILOXANE-BASED COMPOSITION AND CURED PRODUCT THEREOF, AND USE THEREFOR

(71) Applicant: Central Glass Company, Limited, Ube-shi, Yamaguchi (JP)

(72) Inventors: Kazuhiro Yamanaka, Tachikawa (JP); Hiroshi Eguchi, Atlanta, GA (US); Junya Nakatsuji, Fujimino (JP); Takeshi Suda, Fujimino (JP); Katsuhiro Akiyama, Saitama (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/354,068

(22) PCT Filed: Oct. 16, 2012

(86) PCT No.: PCT/JP2012/076683
§ 371 (c)(1),
(2) Date: Apr. 24, 2014

(87) PCT Pub. No.: WO2013/061823
PCT Pub. Date: May 2, 2013

(65) Prior Publication Data
US 2014/0275445 A1    Sep. 18, 2014

(30) Foreign Application Priority Data
Oct. 25, 2011  (JP) .................................. 2011-233640
Oct. 15, 2012  (JP) .................................. 2012-227933

(51) Int. Cl.
| | |
|---|---|
| C08G 77/04 | (2006.01) |
| C08L 83/04 | (2006.01) |
| H01L 23/29 | (2006.01) |
| C08L 63/00 | (2006.01) |
| C08G 77/12 | (2006.01) |
| C08G 77/20 | (2006.01) |
| C08G 77/00 | (2006.01) |

(52) U.S. Cl.
CPC .................. C08G 77/04 (2013.01); C08L 63/00 (2013.01); C08L 83/04 (2013.01); H01L 23/296 (2013.01); *C08G 77/045* (2013.01); *C08G 77/12* (2013.01); *C08G 77/20* (2013.01); *C08G 77/80* (2013.01)

(58) Field of Classification Search
None
See application file for complete search history.

(56) References Cited

U.S. PATENT DOCUMENTS

| | | | |
|---|---|---|---|
| 2007/0197755 A1 | 8/2007 | Sueyoshi et al. | |
| 2008/0166871 A1* | 7/2008 | Allen et al. | 438/623 |
| 2009/0225640 A1 | 9/2009 | Manabe et al. | |
| 2010/0099790 A1 | 4/2010 | Manabe et al. | |

FOREIGN PATENT DOCUMENTS

| | | |
|---|---|---|
| JP | 10-270611 A | 10/1998 |
| JP | 2004-143449 A | 5/2004 |
| JP | 2004-359933 A | 12/2004 |
| JP | 2005-325174 A | 11/2005 |

(Continued)

OTHER PUBLICATIONS

Hasegawa et al., "Rapid Solidification of (2-Hydroxyethyl) trimethylammonium Silicate", Chemistry Letters (1988), The Chemical Society of Japan, pp. 1319-1322.

(Continued)

*Primary Examiner* — Robert S Loewe
(74) *Attorney, Agent, or Firm* — Crowell & Moring LLP

(57) ABSTRACT

A composition containing a metal compound and a siloxane compound (A) represented by general formula (1):

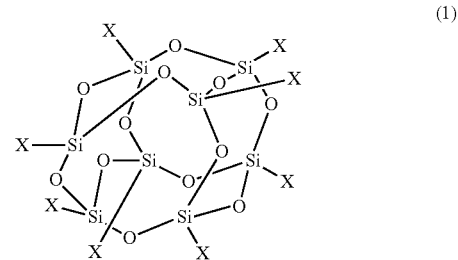

wherein X is represented by general formula X1 or X2:

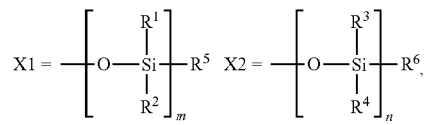

wherein the number of X1 is 1-8; the number of X2 is 0-7; the sum of the number of X1 and the number of X2 is 8; $R^1$ to $R^4$ represent a hydrogen atom, a $C_{1-8}$ alkyl group, alkenyl group, alkynyl group, or a $C_{6-8}$ aryl group, a hydrogen atom thereof optionally being substituted by a fluorine atom; $R^5$ represents a $C_{1-18}$ alkyl group, alkenyl group, alkynyl group or aryl group, a hydrogen atom thereof being optionally substituted by a fluorine atom, a carbon atom being optionally substituted by an oxygen atom or a nitrogen atom; $R^6$ represents a hydrogen atom, a vinyl group or an allyl group; m and n represent an integer of 1-4; and $3 \leq m+n$.

9 Claims, No Drawings

(56) References Cited

FOREIGN PATENT DOCUMENTS

| | | |
|---|---|---|
| JP | 2006-299150 A | 11/2006 |
| JP | 2007-15991 A | 1/2007 |
| JP | 2007-31619 A | 2/2007 |
| JP | 2009-173759 A | 8/2009 |
| JP | 2009-191024 A | 8/2009 |
| JP | 2009-269820 A | 11/2009 |
| JP | 2010-254927 A | 11/2010 |
| JP | 2011-68752 A | 4/2011 |
| WO | WO 2008/010545 A1 | 1/2008 |
| WO | WO 2008/133138 A1 | 11/2008 |
| WO | WO 2012/144480 A1 | 10/2012 |

OTHER PUBLICATIONS

Sudarsanan, et al., "Utility of trichloroisocyanuric acid in the efficient chlorination of silicon hydrides", Journal of Organometallic Chemistry 692 (2007), pp. 1892-1897.

Esteruelas, et al., "Dehalogenation of Hexachlorocyclohexanes and Simultaneous Chlorination of Triethylsilane Catalyzed by Rhodium and Ruthenium Complexes", Organometallics (2004), vol. 23, No. 16, pp. 3891-3897.

Mori, et al., "A Facile Synthesis of Disiloxanes with Functional Groups", Chemistry Letters (1995), pp. 107-108.

Long, et al., "Materials for step and flash imprint lithography (S-FIL)", Journal of Materials Chemistry (2007), 17, pp. 3575-3580.

Hao, et al., "Photocurable Silicon-Based Materials for Imprint Lithography", Emerging Lithographic Technologies XI, Proc. of SPIE, vol. 6517, pp. 651729-1-651729-9 (2007).

Masaki Ito, "Chemistry of Silsesquioxane Materials and Their Applications" (2007), pp. 75-95.

Shintani, et al. "A facile synthesis of hydro- and vinyl-functionalized di- and tetrasiloxanes and polyaddition via hydrosilylation", Polymer Bulletin (1996), vol. 37, pp. 705-710.

Bucca, et al., "Thermally and Oxidatively Stable Thermosets Derived from Preceramic Monomers", Journal of Polymer Science Part A, Polymer Chemistry (1997), vol. 35, pp. 1033-1038.

International Search Report dated Jan. 15, 2013 for PCT/JP2012/076683 with English translation (four (4) pages).

* cited by examiner

SILOXANE-BASED COMPOSITION AND CURED PRODUCT THEREOF, AND USE THEREFOR

TECHNICAL FIELD

The present invention relates to a siloxane-based composition containing a siloxane compound and to a cured product thereof. The siloxane-based composition of the present invention and the cured product thereof is used in a sealing material or adhesive that requires heat resistance (particularly a sealing material for power semiconductors) or in a material requiring transparency such as a sealing material for optical members, a lens and an optical thin film, or particularly in a sealing material for a light emitting diode (hereinafter referred to as LED) or semiconductor laser.

BACKGROUND OF THE INVENTION

A sealing material for semiconductors, LED and the like is required to have heat resistance capable of resisting heat generated by a working semiconductor device and LED. Furthermore, a sealing material for use in optical members such as LED is required to have transparency in addition to heat resistance. As these sealing materials, epoxy resin or silicone had been adopted. In the present specification, silicone refers to polymer compounds having a siloxane bond as a main backbone.

However, conventional sealing materials employing epoxy resin or silicone are not sufficient in heat resistance in the case of a sealing material for a power semiconductor or in the case of high-intensity luminous elements such as a high-intensity LED for automotive headlights or liquid crystal display TV backlights and semiconductor laser and the like, and had been known as bearing problems e.g. a leakage of current due to degradation of the sealing material, a problem of the sealing material becoming yellow etc. Hence a sealing material capable of resisting heat generated from a semiconductor formed containing silicon carbide (SiC) with high voltage resistance (such as a power semiconductor or a high-intensity luminous element) has been demanded.

Accordingly, it is possible to cite polyimide as a heat resistant resin for a sealing material.

For example, Patent Document 1 discloses a resin sealed semiconductor device characterized in that the device is provided with a semiconductor device having a ferroelectric film and a surface protective film and a sealing member formed of resin, the surface protective film being formed of polyimide, wherein the surface protective film is discussed as being cured by heating a polyimide precursor composition film at 230-300° C. However, a polyimide precursor composition is in a solid form around room temperature (20° C.), so that the composition is required to be in a condition dissolved in a solvent at the time of being applied to the device in order to seal the semiconductor device or luminous element. In other words it is not possible to conduct a potting process on the sealing material with no solvent. A potting process is a process of curing a resin liquid, a siloxane liquid and the like dropped on a surface of a substrate by heating them or irradiating them with ultraviolet rays so as to cause polycondensation or addition polymerization, or a process for sealing, for example.

As a material that allows the potting process without solvent and transparent and possibly serves as a heat resistant sealing material, silsesquioxane can be cited.

Silsesquioxane is a network polysiloxane obtained by hydrolysis and polycondensation of an alkyltrialkoxysilane or the like. Silsesquioxane allows such a molecular design as to take full advantage of the high heat resistance that the siloxane skeleton (an inorganic substance) has and the property of an organic group bonded thereto of, and therefore applicable to various uses. Moreover, some silsesquioxanes are in the form of liquid at room temperature, on which a potting process can be conducted.

A method for synthesizing silsesquioxane is disclosed in, for example, Patent Documents 2 to 7 and Non-Patent Documents 1 to 6. Particularly, a heat resistant sealing material that focuses on the transparency of silsesquioxane, for use in optical members such as LED and a semiconductor laser has variously been studied and disclosed in Patent Document 2 and Non-Patent Document 7, for example.

Additionally, in Patent Document 8, a silicon-containing curable composition that contains a platinum-based catalyst (a catalyst for curing reaction) is disclosed.

Furthermore, Non-Patent Document 8 discloses a method for synthesizing a siloxylithium compound and Non-Patent Document 9 discloses a method for synthesizing a disiloxane compound.

REFERENCES ABOUT PRIOR ART

Patent Documents

Patent Document 1: Japanese Patent Application Publication No. H10-270611
Patent Document 2: Japanese Patent Application Publication No. 2004-143449
Patent Document 3: Japanese Patent Application Publication No. 2004-359933
Patent Document 4: Japanese Patent Application Publication No. 2006-299150
Patent Document 5: Japanese Patent Application Publication No. 2007-015991
Patent Document 6: Japanese Patent Application Publication No. 2009-191024
Patent Document 7: Japanese Patent Application Publication No. 2009-269820
Patent Document 8: Japanese Patent Application Publication No. 2005-325174

Non-Patent Document

Non-Patent Document 1: I. Hasegawa et al., Chem. Lett., pp. 1319 (1988)
Non-Patent Document 2: V. Sudarsanan et al., Journal of Organometallic Chemistry, pp. 1892 (2007)
Non-Patent Document 3: M. A. Esteruelas, et al., Organometallics, pp. 3891 (2004)
Non-Patent Document 4: A. Mori et al., Chemistry Letters, pp. 107 (1995)
Non-Patent Document 5: J. Mater. Chem., 2007, 17, 3575-3580
Non-Patent Document 6: Proc. of SPIE Vol. 6517 651729-9
Non-Patent Document 7: "Chemistry of Silsesquioxane Materials and Their Applications" edited by Masaki Ito, in 2007 the first printing issued
Non-Patent Document 8: Polymer Bulletin, vol. 37, pp. 705-710, 1996, K. Shintani Non-Patent Document 9: Daniel Bucca, Teddy M. Keller, Journal of Polymer Science Part A, Polymer Chemistry, vol. 35, pp. 1033, 1997

SUMMARY OF THE INVENTION

Problems to be Solved by the Invention

When used for the high-intensity luminous elements such as LED and semiconductor lasers, the above-mentioned heat resistant sealing material for optical members is required to have a further enhanced heat resistance and a long-period durability free of degradation (e.g. alteration and coloration) under high temperatures. In spite of that, a general-purpose sealing material having transparency and free of degradation even when exposed to high temperatures of 130° C. or more has not been obtained yet.

An object of the present invention is to provide: a siloxane-based composition which possesses greater heat resistance than that of conventional silsesquioxane, takes a liquid form at 60° C. or lower, allows a potting process at room temperature (20° C.), and used for a transparent sealing material free of degradation even when exposed to high temperatures of 130° C. or more for a long period of time; and a cured product thereof.

Means for Solving the Problems

A siloxane-based composition according to the present invention (hereinafter, the composition may be referred to merely as "a composition") is provided to contain, as essential compounds, a specified siloxane compound (A) and at least one kind of metal compound selected from the group consisting of a platinum compound, a palladium compound and a rhodium compound.

When heating the composition of the present invention, bonding reactions are developed e.g. between a Si—H group and a Si—CH=CH$_2$ group so that curing of the composition is progressed. In this case, at least one kind of metal compound selected from the group consisting of a platinum compound, a palladium compound and a rhodium compound is used for the composition as discussed above, in order to accelerate the reaction and obtain a cured product. The composition of the present invention is cured by the action of the metal compound serving as a curing catalyst thereby being able to obtain a cured product which is transparent, free of degradation even when exposed to an environment of 130° C. for a long period of time, and excellent in heat resistance.

In the present invention, alkyl group is a group represented by —CnH$_{2n+1}$, alkylene group is a group represented by —C$_n$H$_{2n}$—, alkenyl group is a group represented by —CH=CH—, alkynyl group is a group represented by —C≡C—, and aryl group is a group derived from an aromatic hydrocarbon and having an aromatic hydrocarbon in the group.

More specifically, the present invention involves the following Inventions 1 to 9.

Invention 1

A composition comprising at least one kind of metal compound selected from the group consisting of a platinum compound, a palladium compound and a rhodium compound, and a siloxane compound (A) represented by general formula (1):

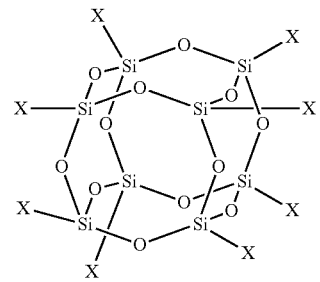

(In the formula, X is mutually independently a group represented by general formula X1 or X2:

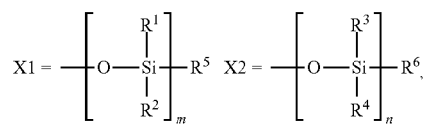

wherein the number of X1 (α) is an integer of 1-8 and the number of X2 (β) is an integer of 0-7 and the sum of α and β is 8. In the formulas X1 and X2, R$^1$ to R$^4$ mutually independently represent a hydrogen atom, a C$_{1-8}$ alkyl group, alkenyl group or alkynyl group, or a C$_{6-8}$ aryl group, a hydrogen atom in these hydrocarbon groups being optionally substituted by a fluorine atom. R$^5$ mutually independently represents a C$_{1-18}$ alkyl group, alkenyl group, alkynyl group or aryl group, a hydrogen atom in these hydrocarbon groups being optionally substituted by a fluorine atom, a carbon atom being optionally substituted by an oxygen atom or a nitrogen atom. R$^6$ mutually independently represents a hydrogen atom, a vinyl group or an allyl group. "m" and "n" mutually independently represent an integer of 1-4, and 3≤m+n.).

Invention 2

A composition of Invention 1, wherein R$^5$ is a methyl group, tertiary butyl group, phenyl group, biphenyl group, naphthyl group, a group represented by general formula (2):

(In the formula, t is an integer of 1-3.), a group represented by general formula (3):

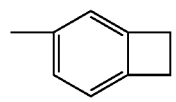

or a group represented by general formula (4):

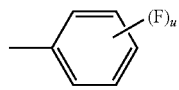

(4)

(In the formula, u is an integer of 1-3.).

Invention 3

A composition of Invention 1 or 2, further comprising at least one kind of compound selected from the group consisting of a siloxane compound (B) represented by general formula (5):

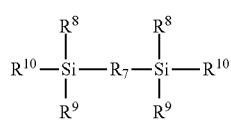

(5)

(In the formula, $R^7$ is an ether bond, a phenylene group or a siloxane group represented by general formula (6):

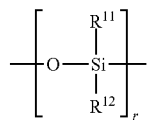

(6)

(In the formula, $R^{11}$ and $R^{12}$ mutually independently represent a hydrogen atom, a $C_{1-8}$ alkyl group, alkenyl group or alkynyl group, or a $C_{6-8}$ aryl group, a hydrogen atom in these hydrocarbon groups optionally being substituted by a fluorine atom, and r is an integer of 1-100.), $R^8$ and $R^9$ mutually independently represent a hydrogen atom, a $C_{1-8}$ alkyl group, alkenyl group or alkynyl group, or a $C_{6-8}$ aryl group, a hydrogen atom in these hydrocarbon groups optionally being substituted by a fluorine atom, and $R^{10}$ is a hydrogen atom or a vinyl group.), a siloxane compound (C) represented by general formula (7):

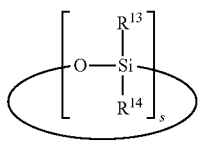

(7)

(In the formula, $R^{13}$ mutually independently represents a hydrogen atom or a vinyl group. $R^{14}$ mutually independently represents a hydrogen atom, a $C_{1-8}$ alkyl group or a $C_{6-8}$ aryl group, a hydrogen atom in these hydrocarbon groups optionally being substituted by a fluorine atom, and s is an integer of 3-7.) and an epoxy compound.

Invention 4

A composition of Invention 3, wherein the epoxy compound contains a glycidyl group, has a number average molecular weight of not lower than 60 and not higher than 10,000 and may contain a carbon-carbon double bond, a carbon-carbon triple bond, an aromatic ring or a heterocyclic ring, some or all of hydrogen atoms in the organic group being mutually independently optionally substituted by a fluorine atom, a chlorine atom, an alkyl group or a fluoroalkyl group.

Invention 5

A cured product obtained by curing a composition of Inventions 1 to 4.

Invention 6

A cured produced as discussed in Invention 5, obtained by heating a composition of Inventions 1 to 4 to not lower than 100° C. and not higher than 300° C. to cure it.

Invention 7

A sealing material comprising a cured product of Invention 5 or 6.

Invention 8

A siloxane compound represented by general formula (8):

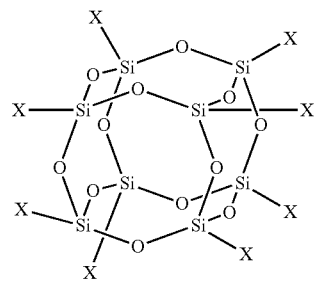

(8)

(In the formula, X is mutually independently a group represented by general formula X1 or X2:

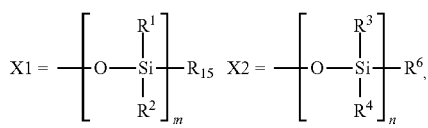

wherein the number of X1 (α) is an integer of 1-8 and the number of X2 (β) is an integer of 0-7 and the sum of α and β is 8. In the formulas X1 and X2, $R^1$ to $R^4$ mutually independently represent a hydrogen atom, a $C_{1-8}$ alkyl group, alkenyl group or alkynyl group, or a $C_{6-8}$ aryl group, a hydrogen atom in these hydrocarbon groups being optionally substituted by a fluorine atom. $R^{15}$ represents a $C_{1-18}$ alkyl group or aryl group, a hydrogen atom in these hydrocarbon groups being optionally substituted by a fluorine atom or a trifluoromethyl group. $R^6$ mutually independently represents a hydrogen atom, a vinyl group or an allyl group. "m" and "n" mutually independently represent an integer of 1-4, and 3≤m+n).

Invention 9

A siloxane compound as discussed in Invention 8, wherein $R^{15}$ is a methyl group, tertiary butyl group, phenyl group, biphenyl group, naphthyl group, a group represented by general formula (2):

(2)

(In the formula (2), t is an integer of 1-3.),
a group represented by general formula (3):

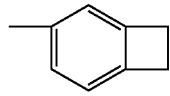
(3)

or a group represented by general formula (4):

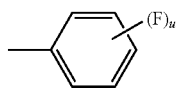
(4)

(In the formula, u is an integer of 1-3.).

Effects of the Invention

The composition of the present invention is in the form of a liquid at temperature of not higher than 60° C., and for example, it allows a potting process at room temperature (20° C.) and provides a transparent cured product by being heated to not lower than 150° C. and not higher than 250° C. The cured product greatly keeps transparency with no color, free of occurrence of foaming and cracks and exhibits an excellent heat resistance even when exposed to a temperature of 140° C. for a long period of time.

MODE(S) FOR CARRYING OUT THE INVENTION

1. Siloxane-Based Composition

First of all, a siloxane-based composition according to the present invention will be discussed.

A composition of the present invention contains a siloxane compound (A) represented by general formula (1) and at least one kind of metal compound selected from the group consisting of a platinum compound, a palladium compound and a rhodium compound, as essential compounds. The composition may further contain at least one kind of compound selected from the group consisting of a siloxane compound (B) represented by general formula (2), a siloxane compound (C) represented by general formula (4) and an epoxy compound.

More specifically, the composition is a composition as discussed in Inventions 1 to 4.

Invention 1

A composition comprising at least one kind of metal compound selected from the group consisting of a platinum compound, a palladium compound and a rhodium compound, and a siloxane compound (A) represented by general formula (1):

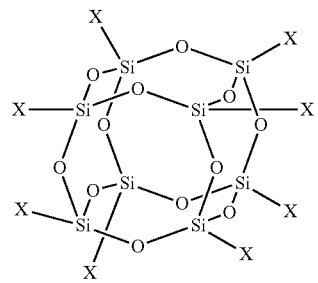
(1)

(In the formula (1), X is mutually independently a group represented by general formula X1 or X2:

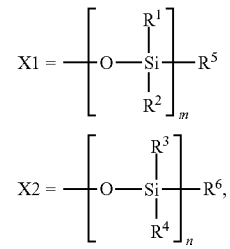

wherein the number of X1 ($\alpha$) is an integer of 1-8 and the number of X2 ($\beta$) is an integer of 0-7 and the sum of $\alpha$ and $\beta$ is 8. In the formulas X1 and X2, $R^1$ to $R^4$ mutually independently represent a hydrogen atom, a $C_{1-8}$ alkyl group, alkenyl group or alkynyl group, or a $C_{6-8}$ aryl group, a hydrogen atom in these hydrocarbon groups being optionally substituted by a fluorine atom. $R^5$ mutually independently represents a $C_{1-18}$ alkyl group, alkenyl group, alkynyl group or aryl group, a hydrogen atom in these hydrocarbon groups being optionally substituted by a fluorine atom, a carbon atom being optionally substituted by an oxygen atom or a nitrogen atom. $R^6$ mutually independently represents a hydrogen atom, a vinyl group or an allyl group. "m" and "n" mutually independently represent an integer of 1-4, and 3≤m+n.).

Invention 2

A composition of Invention 1, wherein $R^5$ is a methyl group, tertiary butyl group, phenyl group, biphenyl group, naphthyl group, a group represented by general formula (2):

(2)

(In the formula (2), t is an integer of 1-3.),
a group represented by general formula (3):

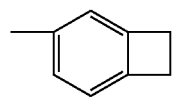
(3)

or a group represented by general formula (4):

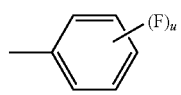

(In the formula, u is an integer of 1-3.).

Invention 3

A composition of Invention 1 or 2, further comprising at least one kind of compound selected from the group consisting of a siloxane compound (B) represented by general formula (5):

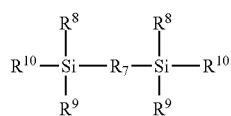

(In the formula, $R^7$ is an ether bond, a phenylene group or a siloxane group represented by general formula (6):

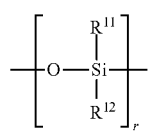

(In the formula, $R^{11}$ and $R^{12}$ mutually independently represent a hydrogen atom, a $C_{1-8}$ alkyl group, alkenyl group or alkynyl group, or a $C_{6-8}$ aryl group, a hydrogen atom in these hydrocarbon groups optionally being substituted by a fluorine atom, and r is an integer of 1-100.), $R^8$ and $R^9$ mutually independently represent a hydrogen atom, a $C_{1-8}$ alkyl group, alkenyl group or alkynyl group, or a $C_{6-8}$ aryl group, a hydrogen atom in these hydrocarbon groups optionally being substituted by a fluorine atom, and $R^{10}$ is a hydrogen atom or a vinyl group.), a siloxane compound (C) represented by general formula (7):

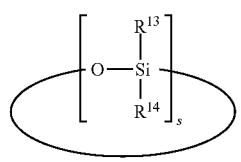

(In the formula, $R^{13}$ mutually independently represents a hydrogen atom or a vinyl group. $R^{14}$ mutually independently represents a hydrogen atom, a $C_{1-8}$ alkyl group or a $C_{6-8}$ aryl group, a hydrogen atom in these hydrocarbon groups optionally being substituted by a fluorine atom, and s is an integer of 3-7.) and an epoxy compound.

Invention 4

A composition of Invention 3, wherein the epoxy compound contains a glycidyl group, has a number average molecular weight of not lower than 60 and not higher than 10,000 and may contain a carbon-carbon double bond, a carbon-carbon triple bond, an aromatic ring or a heterocyclic ring, some or all of hydrogen atoms in the organic group being mutually independently optionally substituted by a fluorine atom, a chlorine atom, an alkyl group or a fluoroalkyl group.

At least one kind of metal compound selected from the group consisting of a platinum compound, a palladium compound and a rhodium compound, particularly a platinum compound provides a high hardness cured product by virtue of the action of a curing catalyst and makes the composition easy to handle at the time of potting process, and therefore preferably not larger than 1.0 mass %, more preferably not smaller than 0.00001 mass % and not larger than 1.0 mass % relative to the total of the composition. The platinum compound content of smaller than 0.00001 mass % inhibits curing. Meanwhile, the platinum compound content of larger than 1.0 mass % impairs the stability of the composition so that the curing reaction becomes difficult to control, and brings a fear of impairing the transparency of the cured product because the platinum compound serves as a coloring component in the cured product. The platinum compound content is much more preferably not smaller than 0.0001 mass % and not larger than 0.05 mass %.

The siloxane compound (B) and the siloxane compound (C) as discussed in Invention 3 can accelerate the thermal curing of the siloxane compound (A). The epoxy compound has the effect of improving adhesion to a substrate while improving a gas barrier property. Hence it is preferable to use these compounds in addition to the siloxane compound (A).

The siloxane compound (B) and the siloxane compound (C) may be used singly or in combination. The total content of the siloxane compound (B), the siloxane compound (C) and the epoxy compound is preferably not less than 1% and not more than 50% by mass relative to the siloxane compound (A). The content of less than 1% does not accelerate curing even when heated. Meanwhile, the content of more than 50% reduces the content of the siloxane compound (A) so that the cured product cannot obtain such a heat resistance as not to allow degradation even when exposed to temperatures of 130° C. or higher for a long period of time. The content is much more preferably not less than 2% and not more than 30%.

2. Siloxane Compound (A)

A siloxane compound (A) is a compound represented by general formula (1):

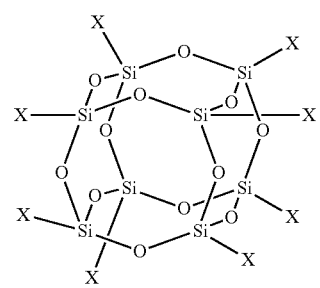

(In the formula (1), X is mutually independently a group represented by general formula X1 or X2:

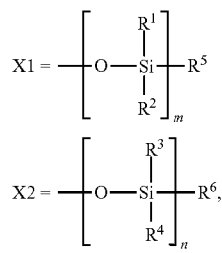

wherein the number of X1 (α) is an integer of 1-8 and the number of X2 (β) is an integer of 0-7 and the sum of α and β is 8. In the formulas X1 and X2, $R^1$ to $R^4$ mutually independently represent a hydrogen atom, a $C_{1-8}$ alkyl group, alkenyl group or alkynyl group, or a $C_{6-8}$ aryl group, a hydrogen atom in these hydrocarbon groups being optionally substituted by a fluorine atom. $R^5$ mutually independently represents a $C_{1-18}$ alkyl group, alkenyl group, alkynyl group or aryl group, a hydrogen atom in these hydrocarbon groups being optionally substituted by a fluorine atom, a carbon atom being optionally substituted by an oxygen atom or a nitrogen atom. $R^6$ mutually independently represents a hydrogen atom, a vinyl group or an allyl group. "m" and "n" mutually independently represent an integer of 1-4, and 3≤m+n.).

In the siloxane compound (A), m is preferably 2 or 4. A siloxane compound (A) in which m is 2 or 4 is easy to synthesize.

The siloxane compound (A) can provide a cured product obtained by heating and curing the composition of the present invention with such a heat resistance as not to allow degradation even when exposed to temperatures of 130° C. or higher for a long period of time.

Additionally, as $R^5$ in X1 of the siloxane compound (A), it is possible to cite a methyl group, ethyl group, isopropyl group, tert-butyl group, phenyl group, tolyl group, tert-butylphenyl group, biphenyl group, naphthyl group, terphenyl group, anthracenyl group, trifluoromethylphenyl group, ditrifluoromethylphenyl group, monofluorophenyl group, difluorophenyl group, methoxyfluorophenyl group, benzocyclobutenyl group, phenylethynylene group, phthalimide group, norborneneimide group, camphor group, adamantyl group, cyclohexyl group and cyclopentyl group.

In the siloxane compound (A) represented by the general formula (1) and used for the composition of Invention 1 of the present invention, it is preferable that $R^5$ is a phenyl group, biphenyl group or naphthyl group, and more preferably a group represented by the formula (2) or a group represented by the formula (3), with consideration given to heat resistance as a cured product. By using the composition of Invention 2 to which the above-mentioned siloxane compound (A) was used, a cured product formed in such a manner as to cure the composition could acquire an excellent heat resistance.

3. Synthesis of Siloxane Compound (A)

A siloxane compound (A) can be synthesized by: synthesizing a precursor (a cage-like siloxane compound); and then subjecting it to silylation and then chlorination; and finally adding an organic group thereto. In other words, the synthesis of a siloxane compound (A) is performed to include [Synthesis of Precursor], [Silylation of Precursor], [Chlorination of Silylated Precursor] and [Addition of Organic Group] in this order.

3-1. Synthesis of Precursor

First of all, the synthesis of a precursor of a siloxane compound (A) represented by a general formula (1) will be discussed.

As concretely shown in the following reaction scheme, tetraalkoxysilane e.g. tetraethoxysilane (hereinafter sometimes abbreviated as "TEOS") is added to an aqueous solution of quaternary ammonium hydroxide and then stirred at room temperature thereby obtaining an ammonium salt as a precursor.

By this reaction, it is possible to obtain a precursor having a cage-like structure in which eight silicon atoms and twelve oxygen atoms form siloxane bonds (—Si—O—) therebetween (this reaction is discussed in Non-Patent Document 1).

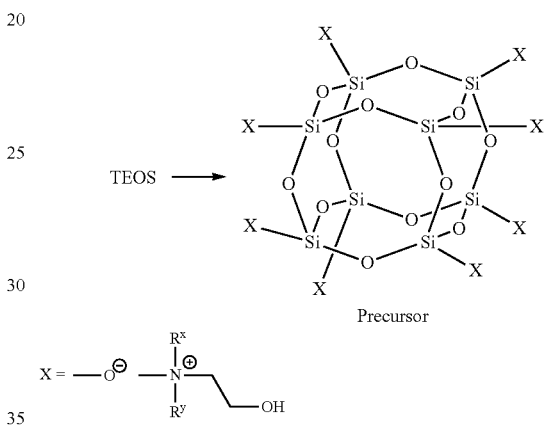

($R^x$ and $R^y$ mutually independently represent a hydrogen atom, a $C_{1-8}$ alkyl group, alkenyl group or alkynyl group, or a $C_{6-8}$ aryl group, a hydrogen atom optionally being substituted by a fluorine atom.)

Incidentally, concrete examples of quaternary ammonium hydroxide include tetramethylamonium, tetraethylamonium, tetrapropylamonium, tetrabutylamonium and choline. Among them, choline is preferably employed since it is obtained in the form of solid and greatly soluble in alcohol used as a reaction solvent in the subsequent reaction (i.e. silylation) for obtaining a siloxane compound (A).

3-2. Synthesis Example of Siloxane Compound (A)

A concrete example of synthesizing a siloxane compound (A) used for a composition of the present invention will be discussed; however, a siloxane compound (A) according to the present invention is not limited to the following siloxane compounds (A-1) to (A-28).

3-2-1. Synthesis of Siloxane Compound (A-1)

As an example of a method for producing a siloxane compound (A) represented by general formula (1), a method of synthesizing the following siloxane compound (A-1) included in a siloxane compound (A) represented by general formula (1) will be discussed step by step.

As mentioned above, "m" in the siloxane compound (A) represented by general formula (1) is an integer of 1-4 and preferably 2 or 4 in view of ease of synthesis. For information, a siloxane compound (A-1) corresponds to the case where m is 2.

The starting material of a siloxane compound is the above-mentioned precursor wherein $R^x$ and $R^y$ are methyl groups.

Siloxane Compound (A-1)

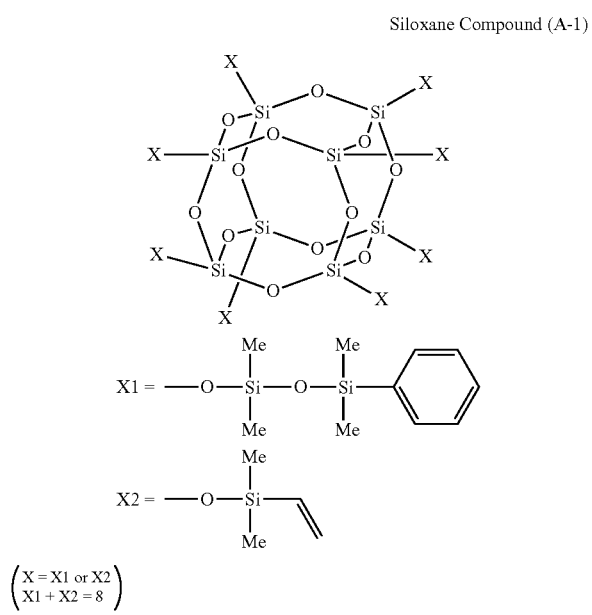

$\begin{pmatrix} X = X1 \text{ or } X2 \\ X1 + X2 = 8 \end{pmatrix}$

[Silylation of Precursor]

Silylation of the above-mentioned precursor is conducted by causing a reaction between the precursor and a silylation reagent. The silylation reagent is exemplified by a halogenated dialkylsilane (such as chlorodimethylsilane) and disiloxane (such as hexamethyldisiloxane). A reaction between the precursor and chlorodimethylsilane is discussed in the above-mentioned Non-Patent Document 1 and a reaction with disiloxane is discussed in the above-mentioned Patent Document 5.

As concretely shown in the following reaction scheme, the precursor is reacted with an alcohol solution of tetramethyldivinylsilane and tetramethylsilane in the presence of an organic base to silylate the precursor, thereby obtaining a silylated precursor produced by silylating the precursor. Incidentally, it is preferable in this reaction to use methanol, ethanol or 2-propanol as alcohol while using triethylamine or pyridine as the organic base. Moreover, in this reaction, the ratio between X1 and X2 in the silylated precursor can be adjusted by the ratio between tetramethyldivinylsilane and tetramethylsilane used in the reaction.

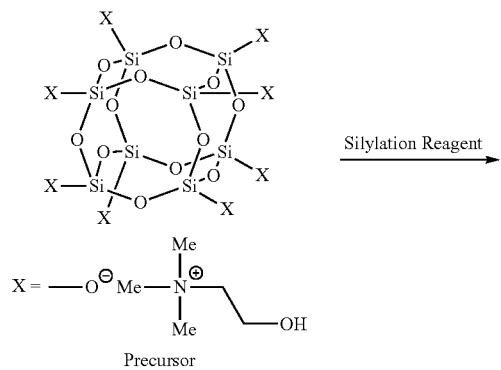

Precursor    Silylation Reagent

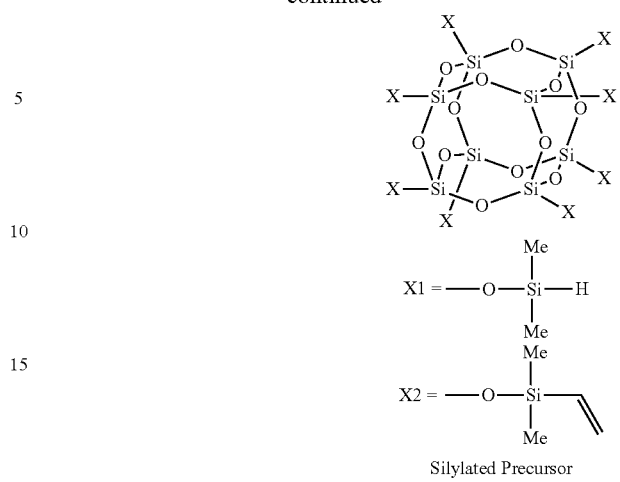

$\begin{pmatrix} X = X1 \text{ or } X2 \\ X1 + X2 = 8 \end{pmatrix}$

[Chlorination of Silylated Precursor]

Chlorination of the silylated precursor is attained by reacting the silylated precursor with trichloroisocyanuric acid or with hexachlorocyclohexane in the presence of a rhodium catalyst or with chlorine gas. For example, a chlorination method as discussed in a publicly known literature (Journal of Organic Chemistry, vol. 692, pp. 1892-1897 (2007), S. Varaprath et al.) may be used without limitation; however, it is particularly preferable to react the silylation precursor with trichloroisocyanuric acid or chlorine gas which forms lesser by-product and economically practical. The reaction between the silylation precursor and trichloroisocyanuric acid is discussed in the above-mentioned Non-Patent Document 2 and the reaction with hexachlorocyclohexane in use of the rhodium catalyst is discussed in the above-mentioned Non-Patent Document 3.

As concretely shown in the following scheme, the silylated precursor is reacted with trichloroisocyanuric acid in an organic solvent thereby obtaining a chlorinated precursor. As the organic solvent, it is preferable to use a chlorine-based solvent such as dichloromethane, chloroform and dichloroethane or tetrahydrofuran.

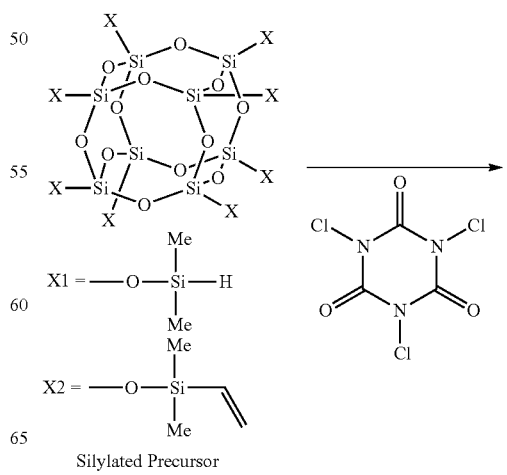

Silylated Precursor

-continued

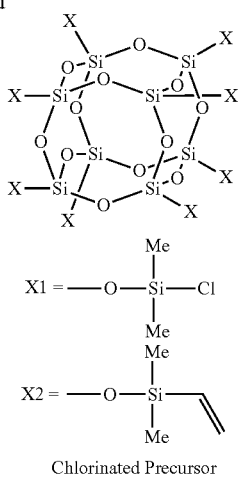

Chlorinated Precursor $$\begin{pmatrix} X = X1 \text{ or } X2 \\ X1 + X2 = 8 \end{pmatrix}$$

[Addition of Organic Group]

A method of adding an organic group to the chlorinated precursor will be discussed.

For example, a halogenated benzene is reacted with an organic metal reagent to exchange a halogen atom for a metal atom and then reacted with the chlorinated precursor thereby obtaining a phenyl group-containing silanolate compound.

As concretely shown in the following reaction scheme, a bromobenzene is reacted with n-butyllithium as the organic metal reagent to obtain phenyllithium, and then reacted with hexamethylcyclotrisiloxane thereby obtaining a phenyl group-containing siloxylithium compound.

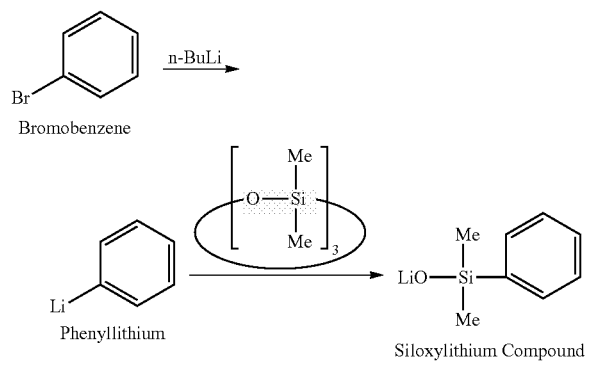

In the case of using an alkylsilanol such as trimethylsilanol, tert-butyldimethylsilanol and the like, a siloxylithium compound can be prepared in a single-step reaction by reacting the silanol and the organic metal reagent such as n-butyllithium. As shown in the following equation, trimethylsilanol is reacted with n-butyllithium thereby obtaining a siloxylithium compound.

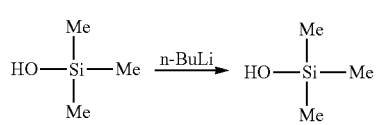

Then, the phenyl group-containing siloxylithium compound is reacted with the chlorinated precursor, thereby obtaining the siloxane compound (A-1) mentioned above as an example of a siloxane compound (A) represented by general formula (1), as shown below.

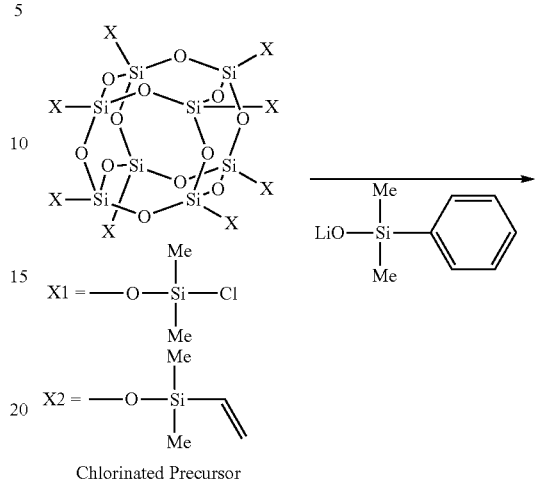

Chlorinated Precursor

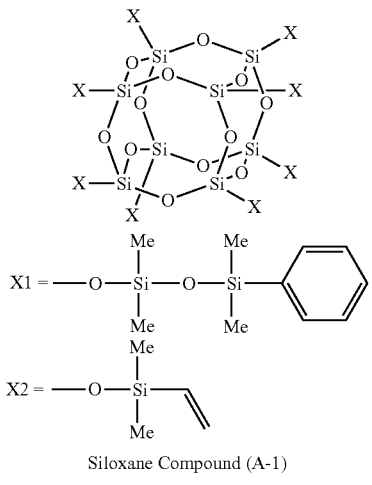

Siloxane Compound (A-1)

$$\begin{pmatrix} X = X1 \text{ or } X2 \\ X1 + X2 = 8 \end{pmatrix}$$

3-2-2. Synthesis of Siloxane Compound (A)

The synthesis of a siloxane compound other than the siloxane compound (A-1) will be explained.

[Silylation of Precursor]

Except for the disiloxane compound used at [Silylation of Precursor] directed to the case of the siloxane compound (A-1) (or except for the mixture of tetramethyldivinylsilane and tetramethylsilane), it is possible to use one kind selected from the group consisting of the following disiloxane compounds or a mixture of two or more kinds of them.

For example, it is possible to cite 1,1,3,3-tetraisopropyldisiloxane, 1,1,3,3-tetraphenyldisiloxane, 1,1,3,3-tetravinyldisiloxane, 1,3-bis((acryloxymethyl)phenethyl)-tetramethyldisiloxane, 1,3-bis(2-aminoethylaminomethyl) tetramethyldisiloxane, 1,3-bis(3-aminopropyl) tetramethyldisiloxane, bis((bicycloheptenyl)ethyl) tetramethyldisiloxane, 1,3-bis(3-carboxypropyl) tetramethyldisiloxane, bis(3-chloroisobutyl) tetramethyldisiloxane, 1,3-bis(chloromethyl) tetramethyldisiloxane, 1,3-bis(cyanopropyl) tetramethyldisiloxane, bis(2-(3,4-epoxycyclohexyl)ethyl) tetramethyldisiloxane, 1,3-bis(glycidoxypropyl) tetramethyldisiloxane, 1,3-bis(hydroxybutyl)

tetramethyldisiloxane, 1,3-bis(hydroxypropyl)tetramethyldisiloxane, 1,3-bis(methacrylamidepropyl)tetramethyldisiloxane, 1,3-bis(3-methacryloxy-2-hydroxypropoxy-propyl)tetramethyldisiloxane, 1,3-bis(3-methacryloxypropyl)tetramethyldisiloxane, bis(methoxytriethyleneoxypropyl)tetramethyldisiloxane, bis(nonafluorohexyl)tetramethyldisiloxane, bis(tridecafluoro-1,1,2,2-tetrahydrooctyl)tetramethyldisiloxane, 1,3-bis(triethoxysilylethyl)tetramethyldisiloxane, 1,3-bis(trifluoropropyl)tetramethyldisiloxane, 1,3-diallyltetramethyldisiloxane, 1,3-dichloro-1,3-diphenyl-1,3-dimethyldisiloxane, 1,3-dichlorotetramethyldisiloxane, 1,3-dichlorotetraphenyldisiloxane, 1,3-diethyltetramethyldisiloxane, 1,3-diethynyltetramethyldisiloxane, 1,3-dimethyltetramethoxydisiloxane, 1,3-diphenyltetramethyldisiloxane, 1,3-divinyl-1,3-dimethyl-1,3-dichlorodisiloxane, 1,3-divinyl-1,3-diphenyl-1,3-dimethyldisiloxane, 1,3-divinyltetraethoxydisiloxane, 1,3-divinyltetramethyldisiloxane, 1,3-divinyltetraphenyldisiloxane, hexaethyldisiloxane, hexamethyldisiloxane, hexaphenyldisiloxane, hexavinyldisiloxane, 1,1,3,3-tetracyclopenthyldichlorodisiloxane, 1,1,3,3-tetraethoxy-1,3-dimethyldichlorosilane, 1,3-tetramethyl-1,3-diethoxydisiloxane, 1,1,3,3-tetraphenyldimethyldisiloxane, 1,1,3,3-tetravinyldimethyldisiloxane, 1-allyl-1,1,3,3-tetramethyldisiloxane, 3-aminopropylpentamethyldisiloxane and chloromethylpentamethyldisiloxane.

Of these disiloxane compounds, 1,1,3,3-tetraphenyldisiloxane is preferably used for introducing a phenyl group in order to improve the obtained siloxane compound (A) in heat resistance. When this disiloxane compound is used, a siloxane compound (A-2) as shown below can be obtained, for example.

Siloxane Compound (A-2)

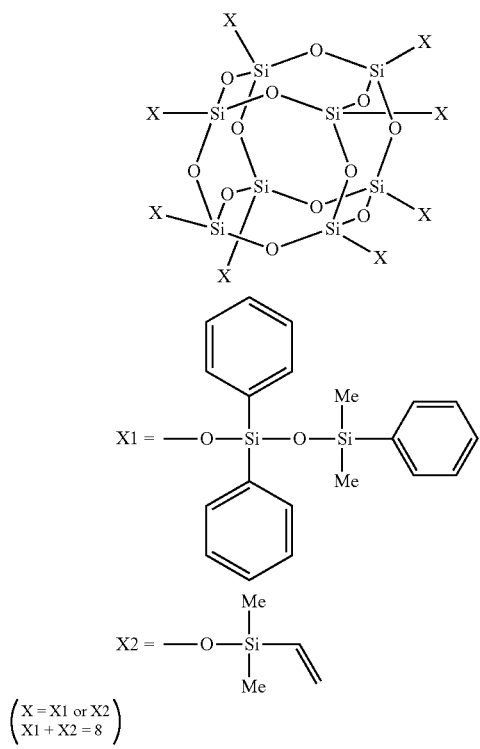

$\begin{pmatrix} X = X1 \text{ or } X2 \\ X1 + X2 = 8 \end{pmatrix}$

[Silylation of Precursor]

Except for the chlorosilane compounds concretely discussed as the silylation reagent at [Silylation of Precursor] directed to the case of synthesizing the siloxane compound (A-1) (or except for chlorodimethylvinylsilane and chlorodimethylsilane), the silylation reagent can be exemplified by trimethylchlorosilane, methylchlorosilane, cyclohexenyldimethylchlorosilane, allyldimethylchlorosilane, vinyldiphenylchlorosilane, vinylmethylphenylchlorosilane, methylphenylchlorosilane, diphenylchlorosilane, glycidyldimethylchlorosilane, methacryloxydimethylchlorosilane and the like. Of these, allyldimethylchlorosilane is preferably used for introducing an allyl group into the siloxane compound (A) in order to impart durability to a film of a cured product, from which the following siloxane compound (A-3) can be obtained.

Siloxane Compound (A-3)

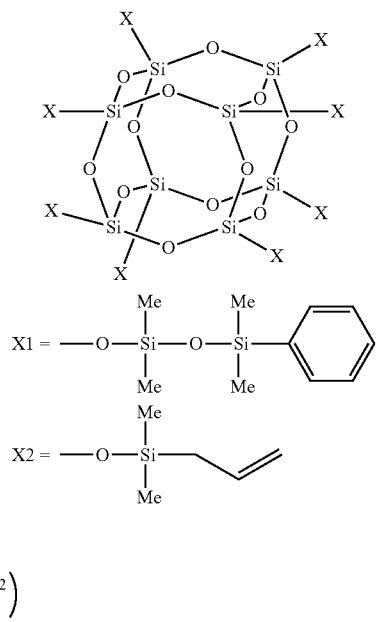

$\begin{pmatrix} X = X1 \text{ or } X2 \\ X1 + X2 = 8 \end{pmatrix}$

[Addition of Organic Group]

As shown in the following equation, brominated form of raw materials are individually brought to be siloxylithium compounds under the procedures discussed in [Addition of Organic Group] directed to the case of synthesizing the siloxane compound (A-1), and then the siloxylithium compounds are individually reacted with a chlorinated precursor thereby obtaining siloxane compounds (A) having biphenyl group (a), naphthyl group (b), groups (c), (d) and (e) represented by general formula (2), a group (f) represented by general formula (4), and a group (g) represented by general formula (3), as $R^5$ in X1 of the general formula (1). A siloxane compound (A) having an alkyl group such as methyl group (h) and a tert-butyl group (i) is synthesized by reacting an alkylsilanol with an organic metal reagent such as n-butyllithium and the like to bring the alkylsilanol to be a siloxylithium compound and then by reacting the siloxylithium compound with a chlorinated precursor as discussed above. The method for synthesizing these siloxane compounds (A) is applicable to a siloxane compound represented by general formula (8).

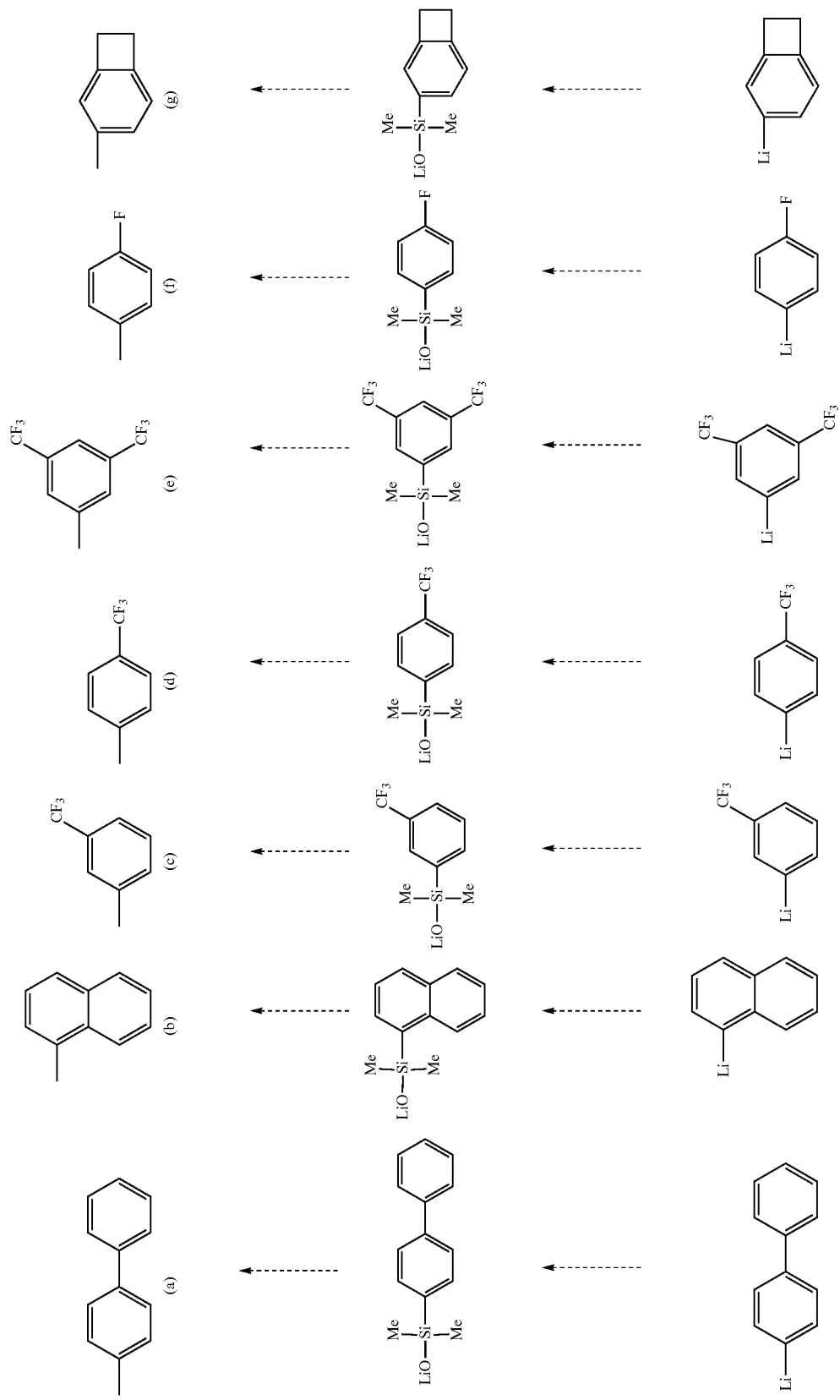

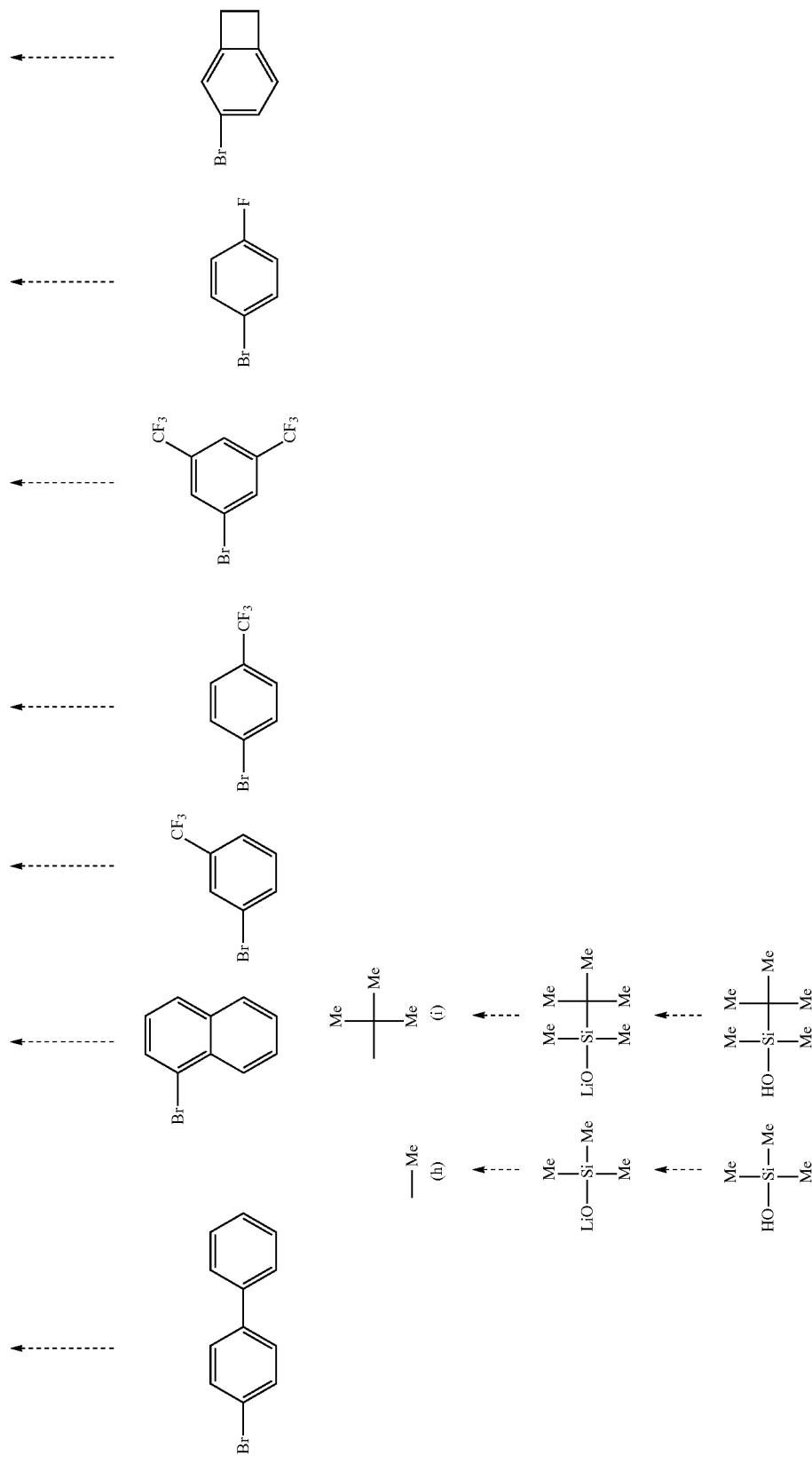

More specifically, it is possible to obtain siloxane compounds (A-4) to (A-8) and siloxane compounds (Aa-1) to (Aa-4) represented by general formula (9):

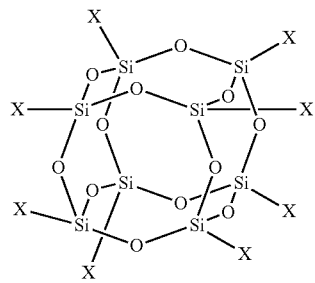

(9)

(In the formula (9), X is mutually independently a group represented by general formula X1 or X2:

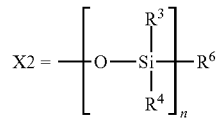

X = X1 or X2
X1 + X2 = 8 wherein the number of X1 ($\alpha$) is an integer of 1-8 and the number of X2 ($\beta$) is an integer of 0-7 and the sum of $\alpha$ and $\beta$ is 8. In the formula X2, $R^3$ and $R^4$ mutually independently represent a hydrogen atom, a $C_{1-8}$ alkyl group, alkenyl group or alkynyl group, or a $C_{6-8}$ aryl group, a hydrogen atom in these hydrocarbon groups being optionally substituted by a fluorine atom. $R^6$ mutually independently represents a hydrogen atom or a vinyl group. "n" mutually independently represents an integer of 1-4), wherein X1 of them are represented by the following formulas (i) to (ix):

X1 =

Siloxane Compound (A-4)

(i)

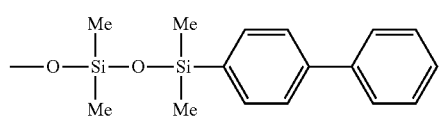

Siloxane Compound (A-5)

(ii)

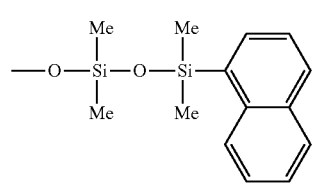

Siloxane Compound (A-6)

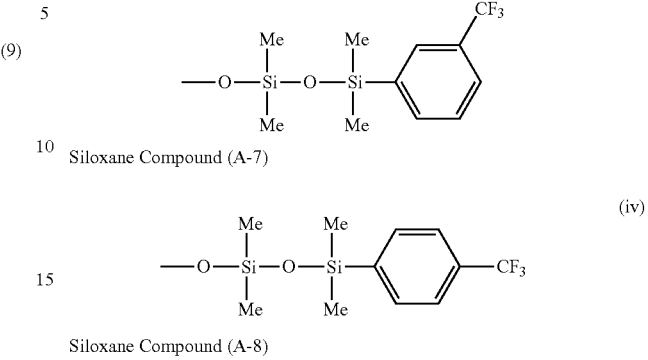

(iii)

Siloxane Compound (A-7)

(iv)

Me Me
—O—Si—O—Si—⟨benzene⟩—CF₃
Me Me

Siloxane Compound (A-8)

(v)

Me Me     CF₃
—O—Si—O—Si—⟨benzene⟩
Me Me     CF₃

Siloxane Compound (Aa-1)

(vi)

Me Me
—O—Si—O—Si—⟨benzene⟩—F
Me Me

Siloxane Compound (Aa-2)

(vii)

Me Me
—O—Si—O—Si—⟨benzocyclobutene⟩
Me Me

Siloxane Compound (Aa-3)

(viii)

Me Me
—O—Si—O—Si—Me
Me Me

Siloxane Compound (Aa-4)

(ix)

Me   Me Me
—O—Si—O—Si—C—Me
Me   Me Me

The process of synthesizing the above-mentioned siloxylithium compound will be now discussed in detail.

As shown in the following equation, a brominated form of $R^5$ (Br—$R^5$) for introducing $R^5$ into X1 of a siloxane compound (A) represented by general formula (1) is prepared as a starting material, and a lithiated form of $R^5$ (Li—$R^5$) is obtained therefrom. A lithiated form of $R^5$ (Li—$R^5$) having the number of moles of "x" is thereafter reacted with a cyclic siloxane having the number of moles of "y" thereby obtaining a siloxylithium compound.

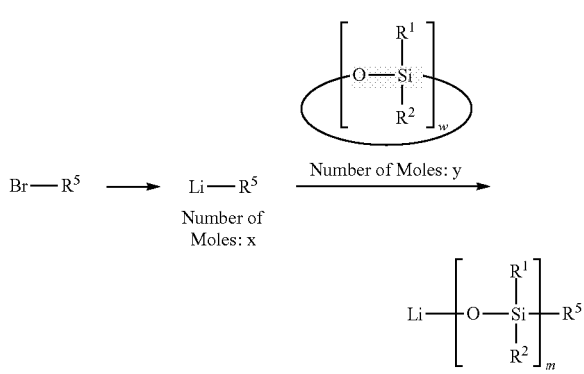

By regulating the mole ratio "x:y" and the number of siloxane units in the cyclic siloxane "w", it is possible to regulate the number of siloxane units in the siloxylithium compound "m" to 1 or 3 as shown in Table 1. This fact is discussed in the above-mentioned Non-Patent Document 8.

TABLE 1

| x:y | w | m |
|---|---|---|
| 1:3 | 3 | 1 |
| 1 | 3 | 3 |
| 1:4 | 4 | 1 |

In the brominated form of $R^5$, concrete examples of $R^5$ are phenyl group, tolyl group, tert-butylphenyl group, biphenyl group, naphthyl group, terphenyl group, anthracenyl group, trifluoromethylphenyl group, ditrifluoromethylphenyl group, monofluorophenyl group, difluorophenyl group, methoxyphenyl group, benzocyclobutenyl group, phenylethynylene group, phthalimide group, norborneneimide group, camphor group, adamantyl group, cyclohexyl group and cyclopentyl group. $R^1$ and $R^2$ are mutually independently concretely exemplified by a hydrogen atom, methyl group, isopropyl group, phenyl group, 2-phenylpropyl group and 3,3,3-trifluoropropyl group.

As mentioned above, it is also possible to synthesize a siloxylithium compound from a reaction caused between an alkylsilanol and n-butyllithium and represented by the following equation. Concrete examples of a functional group Q are methyl group, ethyl group, n-propyl group, isopropyl group, n-butyl group, tert-butyl group and cyclohexyl group. $R^1$ and $R^2$ are mutually independently concretely exemplified by a hydrogen atom, methyl group, isopropyl group, phenyl group, 2-phenylpropyl group and 3,3,3-trifluoropropyl group.

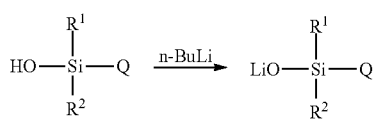

4. Metal Compound

Now, there will be discussed a metal compound which is essential for a composition of the present invention.

A metal compound acts as a curing catalyst in the composition of the present invention so as to provide a cured product with hardness and heat resistance.

The metal compound is required only to have a catalytic effect of accelerating a curing reaction, and selected from the group consisting of a platinum compound, a palladium compound and a rhodium compound. Concretely, it is possible to cite platinum compounds such as platinum-carbonylvinylmethyl complex, platinum-divinyltetramethyldisiloxane complex, platinum-cyclovinylmethylsiloxane complex and platinum-octylaldehyde complex, and palladium compounds and rhodium compounds containing palladium and rhodium in place of platinum. These may be used singly or in combination. A platinum compound is preferably adopted because it attains hardness and it is free of degradation of a cured product after curing and it is readily available.

5. Siloxane Compound (B)

A siloxane compound (B) as discussed in Invention 3, which is to be added to a siloxane compound (A) in the composition of the present invention, will be now explained.

A siloxane compound (B) is added to a siloxane compound (A) to accelerate curing, and more specifically, used for accelerating the thermal curing and obtaining a cured product of the composition of the present invention.

A siloxane compound (B) is a compound represented by general formula (5):

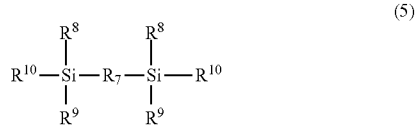

(In the formula, $R^7$ is an ether bond, a phenylene group or a siloxane group represented by general formula (6):

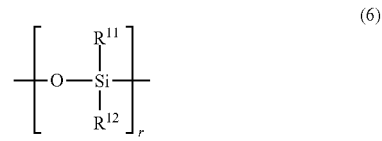

(In the formula, $R^{11}$ and $R^{12}$ mutually independently represent a hydrogen atom, a $C_{1-8}$ alkyl group, alkenyl group or alkynyl group, or a $C_{6-8}$ aryl group, a hydrogen atom in these groups optionally being substituted by a fluorine atom, and r is an integer of 1-100.), $R^8$ and $R^9$ mutually independently represent a hydrogen atom, a $C_{1-8}$ alkyl group, alkenyl group or alkynyl group, or a $C_{6-8}$ aryl group, a hydrogen atom in these hydrocarbon groups optionally being substituted by a fluorine atom, and $R^{10}$ is a hydrogen atom or a vinyl group.)

It is preferable that a siloxane compound (B) is a compound having two or more —Si—H groups or two or more —Si—CH=CH$_2$ groups within the same structure. As concrete examples, there can be cited tetramethyldisiloxane, 1,4-bis(dimethylsilyl)benzene, 1,2-bis(dimethylsilyl)benzene, bis((p-dimethylsilyl)phenyl)ether, 1,4-bis(vinyldimethylsilyl)benzene, 1,1,3,3,5,5-hexamethyltrisiloxane, phenyltris(dimethylsiloxy)silane, 1,1,3,3-tetraisopropyldisiloxane, tetrakis(dimethylsilyloxy)silane and 1,5-dimethyl-2,5-disilahexane. As commercially available products, it is possible to cite vinyl-terminated polydimethylsiloxane (for example, available from Gelest, Inc. under the trade name of DMS-5 series), diphenylsiloxane-modified polydimethylsiloxane (for example, available from Gelest, Inc. under the trade name of PDV series), trifluoropropyl-modified polydimethylsiloxane (for example, available from Gelest, Inc. under the trade name of FMV and EDV series), vinyl-modified polydimethylsiloxane (available from Gelest, Inc. under the trade name of VDT, VDS, VDV, VGM, VGP, VGF and VMS series), Si—H-terminated polydimethylsiloxane (available from Gelest, Inc. under the trade name of DMS-H series), Si—H-modified polydimethylsiloxane (available from Gelest, Inc. under the trade name of HMS and HES series), phenyl-modified polydimethylsiloxane (available from Gelest, Inc. under the trade name of HDP and HPM series), and the like. These compounds may be used singly or mixed in combination.

6. Siloxane Compound (C)

A siloxane compound (C) to be used for the composition of the present invention will be now explained.

A siloxane compound (C) has the effect of accelerating curing, at the time for accelerating the thermal curing and obtaining a cured product of the composition of the present invention.

A siloxane compound (C) is a compound represented by general formula (7):

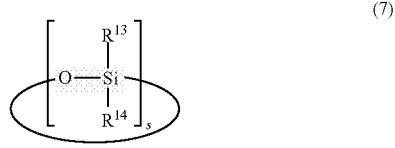

(7)

(In the formula, $R^{13}$ mutually independently represents a hydrogen atom or a vinyl group. $R^{14}$ mutually independently represents a hydrogen atom, a $C_{1-8}$ alkyl group or a $C_{6-8}$ aryl group, a hydrogen atom in these hydrocarbon groups optionally being substituted by a fluorine atom, and s is an integer of 3-7.)

It is preferable that a siloxane compound (C) is a compound having two or more —Si—H groups or two or more —Si—CH=$CH_2$ groups within the same structure. As concrete examples, there can be cited trimethylcyclotrisiloxane, tetramethylcyclotetrasiloxane, pentamethylcyclopentasiloxane, cyclotrisiloxane, cyclotetrasiloxane, cyclopentasiloxane, trivinyltrimethylcyclotrisiloxane, tetravinyltetramethylcyclotetrasiloxane, pentavinylpentamethylcyclopentasiloxane, triphenylcyclotrisiloxane, tetraphenylcyclotetrasiloxane, pentaphenylcyclopentasiloxane and the like. These compounds may be used singly or mixed in combination.

7. Epoxy Compound

An epoxy compound to be used in the composition of the present invention will be now explained.

An epoxy compound is for obtaining the effect of enhancing the adherence of a cured product of the composition of the present invention to various substrates such as a glass substrate and a silicon substrate, and the effect of improving a gas barrier property.

As an epoxy compound, it is possible to cite epoxy compounds obtained by bringing a compound of phenol novolac resin, cresol novolac resin, aromatic hydrocarbon formaldehyde resin-modified phenol resin, dicyclopentadiene-modified phenol resin, phenolaralkyl resin, cresolaralkyl resin, naphtholaralkyl resin, biphenyl-modified phenolaralkyl resin, phenol trimethylolmethane resin, tetraphenylolethane resin, naphthol novolac resin, naphthol-phenol co-condensation novolac resin, naphthol-cresol co-condensation novolac resin, biphenyl-modified phenol resin or aminotriazine-modified phenol resin into contact with epichlorohydrin thereby being modified with epoxy group.

These are commercially available and exemplified by a bisphenol A type epoxy resin available from DIC Corporation under the trade name of Epiclon 840, a bisphenol F type epoxy resin available from ADEKA Corporation under the trade name of Adekaresin EP-4901, cresol novolac type epoxy resins available from DIC Corporation under the trade name of Epiclon N-600 series, dicyclopentadiene type resin available from DIC Corporation under the trade name of Epiclon HP-7200 series, triazine type resins available from Nissan Chemical Industries, Ltd. under the trade name of TEPIC series, and a cyanuric acid type resin available from SHIKOKU CHEMICALS CORPORATION under the trade name of DA-MGIC.

As an epoxy compound, it is possible to cite an epoxy compound preferably containing a glycidyl group, having a number average molecular weight of 60-10,000 and optionally containing a carbon-carbon double bond, a carbon-carbon triple bond, an aromatic ring or a heterocyclic ring, wherein some or all of hydrogen atoms in the organic group are mutually independently optionally substituted by a fluorine atom, a chlorine atom, an alkyl group or a fluoroalkyl group.

An epoxy compound represented by general formula (7) is synthesized from alcohol as shown below and epichlorohydrin.

Examples of alcohol are 1,4-cyclohexanediol, 1,3-adamantanediol, catechol, 1,3-benzenediol, 2,2'-dihydroxybiphenyl, 4,4'-dihydroxybiphenyl, 2,2'-methylenediphenol, 4,4'-methylenediphenol, ethylene glycol, propylene glycol, 2,2-bis(4-hydroxyphenyl)-propane, 2,2-bis(4-hydroxyphenyl)-3-methylpropane, 2,2-bis(4-hydroxyphenyl)-butane, 3,3-bis(4-hydroxyphenyl)-pentane, 2,2-bis(4-hydroxyphenyl)-4-methylpentane, 3,3-bis(4-hydroxyphenyl)-hexane, 2,2-bis(3-chloro-4-hydroxyphenyl)-propane, 2,2-bis(3,5-dichloro-4-hydroxyphenyl)-propane, 2,2-bis(3-bromo-4-hydroxyphenyl)-propane, 2,2-bis(3,5-dibromo-4-hydroxyphenyl)-propane, 2,2-bis(3-methyl-4-hydroxyphenyl)-propane, 2,2-bis(4-hydroxyphenyl)-1,1,1,3,3,3-hexafluoropropane, 2,6-dihydroxynaphthalene, 2,3-dihydroxynaphthalene, 2,7-dihydroxynaphthalene, 1,4-dihydroxynaphthalene, 1,5-dihydroxynaphthalene, 2,3-dihydroxypyridine, 2,4-dihydroxypyridine, 4,4'-dihydroxydiphenyl ether, 4,4'-dihydroxydiphenyl sulfide, 4,4'-dihydroxydiphenyl sulfoxide, 4,4'-dihydroxydiphenyl sulfone, 4,4'-dihydroxybenzophenone, 1,4-dihydroxy hexane, 2,2-bis(4-hydroxycyclohexyl)-propane, 1,1'-methylenedi-2-naphthol, 4,4'4"-trihydroxytriphenylmethane, 1,1,1-tris(4-hydroxyphenyl)ethane and α,α,α'-tris(4-hydroxyphenyl)-1-ethyl-4-isopropylbenzene.

In the composition of the present invention, the epoxy compound may be used in combination with an agent for curing epoxy resins. The curing agent can be concretely exemplified by amine-based compounds, acid anhydride-based compounds, amide-based compounds, phenol-based compounds, mercaptan-based compounds, imidazole-based compounds, polysulfide resin-based compounds and phosphorous-based compounds. More specifically, it is possible to cite: thermal curing agents such as diaminodiphenylmethane, diaminodiphenyl sulfone, diethylenetriamine, triethylenetetramine, polyalkylene glycol polyamine, phthalic anhydride, trimellitic anhydride, pyromellitic anhydride, maleic anhydride, tetrahydrophthalic anhydride, methyltetrahydrophthalic anhydride, methyl nadic anhydride, hexahydrophthalic anhydride, methylhexahydrophthalic anhydride, 2-methylimidazole, triphenyl phosphine, 2-ethyl-4-methylimidazole, $BF_3$ amine complexes and guanidine derivatives; and ultraviolet curing agents such as diphenyliodonium hexafluorophosphate and triphenylsulfonium hexafluorophosphate.

8. Additive and Filler

It is also possible to add other various kinds of resins, fillers, additives and the like to the composition of the present invention within a range that a cured product containing the composition of the present invention does not impair the performances aimed by the present invention. The various kinds of resins are exemplified by polyimide resin, polyether resin, polyurethane resin, phenol resin, polyester resin, melamine resin, polyamide resin and polyphenylene sulfide resin. The additives are exemplified by UV absorbers, antistatic agents, antioxidant, yellowing inhibitors and the like.

Furthermore, it is possible to adjust the viscosity in a potting process of the composition of the present invention within a range that a cured product containing the composition of the present invention does not impair the performances aimed by the present invention. Moreover, it is also possible to add inorganic fine particles within a range not impairing the performances aimed by the present invention, for the purpose of improving the cured product containing the composition of the present invention in heat resistance, transparency and the like. Examples of the inorganic fine particles are silicon dioxide fine particles, colloidal silica, silica filler, aluminium oxide, zinc oxide, zirconium phosphate tungstate and the like; particularly, silicon dioxide fine particles are preferable. In order not to impair the transparency of the cured product, these preferably have a particle diameter of 50 µm or smaller. These inorganic fine particles are exemplified by a product available from Momentive Performance Materials Worldwide Inc. under the trade name of Tospearl, a product available from Wacker Asahikasei Silicone Co., Ltd. under the trade name of Wacker HDK, a product available from Nippon Aerosil Co., Ltd. under the trade name of Aerosil, fused silica available from DENKI KAGAKU KOGYO KABUSHIKI KAISHA under the trade name of FB and the like.

9. Method of Producing Cured Product

The composition of the present invention cause bonding reactions between —Si—H group and —Si—CH=$CH_2$ group or the like when heated, with which the curing is developed. By using the above-mentioned compound of platinum, palladium or rhodium as the composition in order to develop the reaction and by curing the composition under the action of the metal compound as a curing catalyst, a cured product free of degradation even when exposed to an environment of 130° C. can be obtained.

Though curing may be developed even when allowed to stand for a long period of time at room temperature, the curing temperature is preferably not lower than 100° C. and not higher than 300° C., more preferably not lower than 100° C. and not higher than 200° C. If the curing temperature is lower than 100° C., the cured product has difficulty in acquiring hardness. Meanwhile, curing is more developed by increasing the temperature, but a curing temperature of higher than 300° C. raises a fear of occurrence of cracks and therefore not practical. The curing time is preferably not shorter than 0.5 hour and not longer than 10 hours, more preferably not shorter than 1 hour and not longer than 4 hours. A curing time of shorter than 0.5 hour raises a fear that the effect is not sufficiently developed, while a curing time of longer than 10 hours is not practical.

Additionally, the composition of the present invention is in the form of transparent liquid at room temperature (20° C.) to 60° C. and keeps a good transparency even in a semi-cured condition, so that it is also possible to add a catalyst having photoreactivity (the catalyst may hereinafter be referred to as a photoreactive catalyst) to the composition to cure it by light.

It is possible to introduce a photofunctional group into any of a siloxane compound (A), a siloxane compound (B) and a siloxane compound (C) contained in the composition of the present invention, and additionally it is also possible to introduce a monomer or resin reactive with the photoreactive catalyst in addition to the compositions.

When thermal curing and photo-curing are used in combination, a material excellent in weatherability, hardness, gas barrier performance, extensibility and toughness while maintaining good heat resistance and high transparency can be obtained.

Concerning the fluidity of the composition of the present invention, the composition of the present invention has a viscosity (measured by a rotational viscometer) of not more than 50 Pa·S at 25° C. or lower, and sometimes has a viscosity of not more than 10 Pa·S. The fluidity is obtainable within a range of room temperature (20° C.) to 60° C., in which case the composition is easy to handle at the time of potting process and the like.

In a cured product formed by curing the composition of the present invention, the temperature at which a 5 mass % reduction of the mass of the cured product is confirmed by development of curing is 300° C. or more and sometimes 350° C. or more.

EXAMPLES

Referring now to Examples, the present invention will be discussed in detail; however, the present invention is not limited to those examples.

More specifically, a precursor A of the above-mentioned siloxane compound (A) was synthesized, and then silylated precursors (S-1) to (S-5) derived from the precursor A were synthesized, followed by synthesizing siloxane compounds (A-1) and (A-9) to (A-28) that belonged to the siloxane compound (A) and derived from the silylated precursors (S-1) to (S-5).

A platinum compound was added to these siloxane compounds (A) thereby preparing compositions (1-1) to (1-10). Then, a siloxane compound (B) and a platinum compound were added to the siloxane compounds (A) thereby preparing compositions (2-1) to (2-9). Then, a siloxane compound (B), a siloxane compound (C) and a platinum compound were added to the siloxane compounds (A) thereby preparing compositions (3-1) to (3-15). Then, a siloxane compound (C) and a platinum compound were added to the siloxane compounds (A) thereby preparing compositions (4-1) to (4-10). These compositions were heated to provide cured products, followed by evaluating their transparency and heat resistance.

Incidentally, the properties of the siloxane compound, the composition and the cured product thereof, obtained according to Examples were evaluated by the following method.

<NMR (Nuclear Magnetic Resonance) Measurement>

Measurements at $^1$H-NMR, $^{19}$F-NMR and $^{29}$Si-NMR were conducted in use of a nuclear magnetic resonance spectrometer (available from JEOL Ltd.) of 400 MHz resonance frequency.

<Measurement of Viscosity>

The viscosity at 25° C. was measured with use of a rotational viscometer (available from Brookfield Engineering Laboratories, Inc. under the trade name of DV-II+PRO) and a temperature control unit (available from Brookfield Engineering Laboratories, Inc. under the trade name of THERMOSEL).

<Light Transmittance>

The light transmittance was measure by using an ultraviolet and visible spectrophotometer (UV-3150 model available from SHIMADZU CORPORATION).

[Synthesis of Siloxane Compound (A)]

First of all, the synthesis of a siloxane compound (A) to be used in the composition of the present invention will be discussed. More specifically, the synthesis of a precursor A for the above-mentioned siloxane compound (A), the synthesis of silylated precursors (S-1) to (S-5) derived from the precursor A, the synthesis of siloxane compounds (A-1) and (A-9) to (A-28) derived from the silylated precursors (S-1) to (S-5) will be explained in orderly sequence.

1. Synthesis of Precursor A

A 1 L three-neck flask having a thermometer and a reflux condenser was charged with 200 g (960 mmol) of tetraethoxysilane and 233 g (960 mmol) of a 50 mass % choline hydroxide aqueous solution and stirred at room temperature (20° C.) for 12 hours. After the termination of stirring, 100 g of 2-propanol was added thereto and stirred again for 30 minutes, followed by cooling it to 3° C. A precipitated crude product was filtered out and rinsed with 2-propanol and then dried, thereby obtaining 151 g of octa(2-hydroxyethyltrimethylammonium)silsesquioxane hexatricontahydrate (represented by the following structural formula) as a precursor A in the form of white particles at a 62 mass % yield.

The structural formula of octa(2-hydroxyethyltrimethylammonium)silsesquioxane hexatricontahydrate is as shown below.

Precursor A

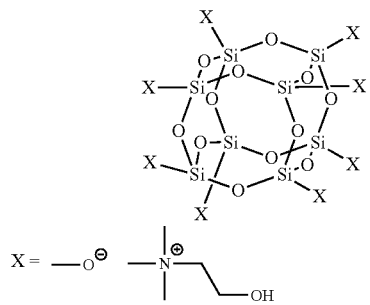

<Result of NMR Measurement>

$^1$H NMR (Solvent: Deuterated methanol, Standard substance: Tetramethylsilane); δ=3.23 (s, 9H), 3.48-3.51 (m, 2H), 4.02-4.05 (m, 2H), 2. Synthesis of Silylated Precursor A Subsequently, silylation of the above-mentioned precursor A was conducted with use of a silylation reagent thereby obtaining a silylated precursor. By modifying the silylation reagent, different kinds of silylated precursors (S-1) to (S-5) were synthesized.

2-1. Precursor A→Silylated Precursor (S-1)

The above-mentioned precursor A was silylated to obtain a silylated precursor (S-1).

To be more specific, a 1 L three-neck flask having a thermometer and a reflux condenser was charged with 350 g of toluene, 30 g of methanol, 26.5 g (198 mmol) of tetramethyldisiloxane as a silylation reagent, and 23.9 g (198 mmol) of tetramethyldivinyldisiloxane and cooled to 3° C. With stirring the flask, 54.1 g of a 69 mass % nitric acid was added dropwise thereinto during 30 minutes. After the 30 minutes of stirring, a methanol solution obtained by dissolving 100 g (49.3 mmol) of the above-mentioned octa(2-hydroxyethyltrimethylammonium)silsesquioxane hexatricontahydrate in 100 g of methanol was added into the flask, followed by increasing the temperature thereof to room temperature with stirring. Stirring was continued for 12 hours at room temperature to develop a silylation reaction. After completing the stirring, a water phase was removed and an organic phase was rinsed with 100 g of clean water three times, followed by drying the organic phase by 10 g of magnesium sulfate. Thereafter magnesium sulfate was filtered out and reduced-pressure condensation was conducted. The thus obtained crude product was rinsed with methanol and then dried, thereby obtaining 46.0 g (45.0 mmol) of tetra(hydrodimethylsiloxy)tetra(vinyldimethylsiloxy)silsesquioxane (represented by the following structural formula) as a silylated precursor (S-1) in the form of white particles. Incidentally, the yield was 91 mass %. The ratio between X1 and X2 was X1:X2=4:4 in terms of the average number of them.

Silylated Precursor (S-1)

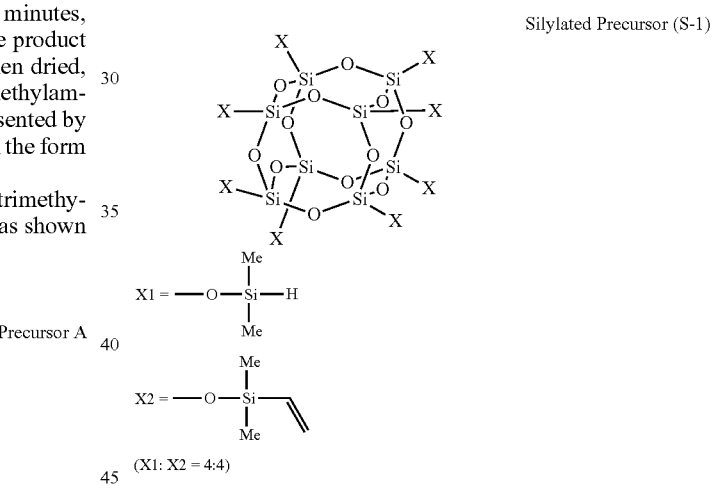

<Result of NMR Measurement>

$^1$H NMR (Solvent: Deuterated chloroform, Standard substance: Tetramethylsilane); δ=0.18-0.24 (m, 12H), 4.70-4.72 (m, 1H), 5.75-5.81 (m, 1H), 5.93-5.96 (m, 1H), 5.97-6.15 (m, 1H), $^{29}$Si NMR (Solvent: Deuterated chloroform, Standard substance: Tetramethylsilane); δ=0.9, −1.7, −108.7, −109.0

2-2. Precursor A→Silylated Precursor (S-2)

The above-mentioned precursor A was silylated to obtain a silylated precursor (S-2).

To be more specific, operations were performed under the same procedure as in the reaction for obtaining the silylated precursor (S-1) with the exception that 19.9 g (149 mmol) of tetramethyldisiloxane and 30.6 g (248 mmol) of tetramethyldivinyldisiloxane were used as the silylation reagent to silylate the precursor A, thereby obtaining 49.4 g (43.0 mmol) of tri(hydrodimethylsiloxy)hepta(vinyldimethylsiloxy)silsesquioxane (represented by the following structural formula) as a silylated precursor (S-2). Incidentally, the yield was 87 mass %. The ratio between X1 and X2 was X1:X2=3:5 in terms of the average number of them.

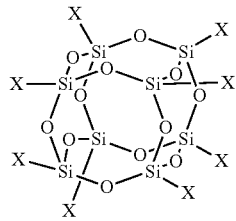

Silylated Precursor (S-2)

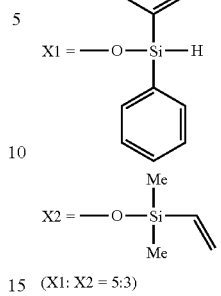

(X1: X2 = 5:3)

2-4. Precursor A→Silylated Precursor (S-4)

The above-mentioned precursor A was silylated to obtain a silylated precursor (S-4).

To be more specific, operations were performed under the same procedure as in the reaction for obtaining the silylated precursor (S-1) with the exception that 53.0 g (396 mmol) of tetramethyldisiloxane was used as the silylation reagent to silylate the precursor A, thereby obtaining 43.8 g (43.0 mmol) of octa(hydrodimethylsiloxy)silsesquioxane (represented by the following structural formula) as a silylated precursor (S-4). Incidentally, the yield was 87 mass %. The ratio between X1 and X2 was X1:X2=8:0 in terms of the average number of them.

The structural formula of silylated precursor (S-4) is as shown below.

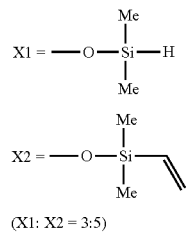

(X1: X2 = 3:5)

<Result of NMR Measurement>

$^1$H NMR (Solvent: Deuterated chloroform, Standard substance: Tetramethylsilane): δ=0.18-0.24 (m, 36H), 4.70-4.72 (m, 3H), 5.75-5.81 (m, 5H), 5.93-5.96 (m, 5H), 5.97-6.15 (m, 5H), $^{29}$Si NMR (Solvent: Deuterated chloroform, Standard substance: Tetramethylsilane): δ=0.9, -1.7, -108.7, -109.0

2-3. Precursor A→Silylated Precursor (S-3)

The above-mentioned precursor A was silylated to obtain a silylated precursor (S-3).

To be more specific, operations were performed under the same procedure as in the reaction for obtaining the silylated precursor (S-1) with the exception that 39.8 g (297 mmol) of tetraphenyldisiloxane and 15.3 g (99 mmol) of tetramethyldivinyldisiloxane were used as the silylation reagent to silylate the precursor A, thereby obtaining 36.3 g (21.0 mmol) of hepta(hydrodiphenylsiloxy)tri(vinyldimethylsiloxy)silsesquioxane (represented by the following structural formula) as a silylated precursor (S-3). Incidentally, the yield was 43 mass %. The ratio between X1 and X2 was X1:X2=5:3 in terms of the average number of them.

Silylated Precursor (S-3)

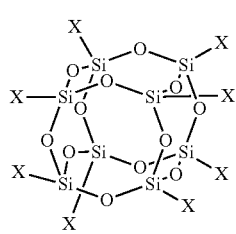

Silylated Precursor (S-4)

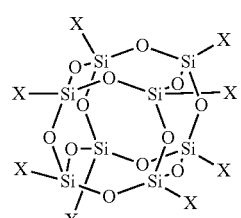

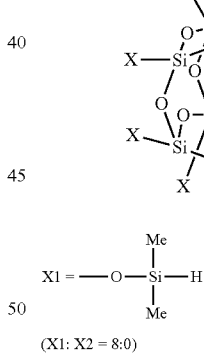

(X1: X2 = 8:0)

<Result of NMR Measurement>

$^1$H NMR (Solvent: Deuterated chloroform, Standard substance: Tetramethylsilane); δ=0.25 (s, 6H), 4.70-4.72 (m, 1H), $^{29}$Si NMR (Solvent: Deuterated chloroform, Standard substance: Tetramethylsilane); δ=-1.3, -108.6

2-5. Precursor A→Silylated Precursor (S-5)

A 500 mL three-neck flask having a thermometer and a reflux condenser was charged with 70 g of toluene, 6 g of methanol and 38.7 g (79.6 mmol) of a disiloxane compound (represented by the following formula) as a silylation reagent, and then cooled to 3° C.

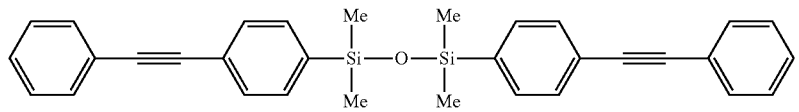 [SMILES: C[Si](C)(O[Si](C)(C)c1ccc(C#Cc2ccccc2)cc1)c1ccc(C#Cc2ccccc2)cc1]

For information, synthesis of this siloxane compound was conducted by reference to the description of the above-mentioned Non-Patent Document 9.

With stirring the flask, 11 g of a nitric acid of 69 mass % concentration was added dropwise thereinto during 30 minutes. After the 30 minutes of stirring, a methanol solution obtained by dissolving 20 g (9.9 mmol) of octa(2-hydroxyethyltrimethylammonium)silsesquioxane hexatricontahydrate in 20 g of methanol was added into the flask, followed by increasing the temperature thereof to room temperature with stirring. Stirring was continued for 12 hours at room temperature. Then, a water phase was removed and an organic phase was rinsed with 100 g of clean water three times, followed by drying the organic phase by 10 g of magnesium sulfate. Thereafter magnesium sulfate was filtered out and reduced-pressure condensation was conducted. The thus obtained crude product was rinsed with methanol and then dried, thereby obtaining 10.4 g (5.0 mmol) of a silylated precursor (S-5) represented by the following formula in the form of white particles. Incidentally, the yield was 50 mass %. The ratio between X1 and X2 was X1:X2=6:2 in terms of the average number of them.

Silylated Precursor (S-5)

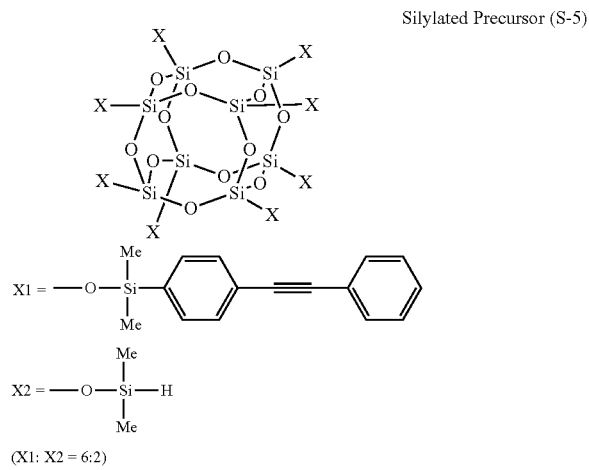

(X1: X2 = 6:2)

3. Synthesis of Siloxane Compound (A)

Subsequently, siloxane compounds (A-1) and (A-9) to (A-28) were synthesized from the above-mentioned silylated precursors (S-1) to (S-5). Respective examples of synthesizing these siloxane compounds will be discussed below.

3-1. Silylated Precursor (S-1)→Siloxane Compound (A-1)

A 300 mL three-neck flask having a thermometer and a reflux condenser was charged with 50.0 g of tetrahydrofuran and 11.2 g (10.0 mmol) of the silylated precursor (S-1) and then cooled to −78° C. with stirring. After the inner temperature reached −78° C., 3.41 g (15.0 mmol) of trichloroisocyanuric acid was added thereto. After the addition, the contents were stirred for 30 minutes at −78° C. and then increased in temperature to room temperature with stirring. A precipitated insoluble substance was filtered out thereby obtaining a tetrahydrofuran solution.

Thereafter, a 1 L three-neck flask having a thermometer and a reflux condenser was charged with 6.3 g (40.0 mmol) of 4-bromobenzene and 50 g of diethyl ether and then cooled to −78° C. with stirring. After the inner temperature reached −78° C., 28 mL (45 mmol) of a 1.6 mol/L butyllithiumhexane solution was added dropwise thereto during 30 minutes. After the dropwise addition, stirring was carried out for 30 minutes, followed by the addition of 29.6 g (133 mmol) of hexamethylcyclotrisiloxane. It was increased in temperature to room temperature with stirring and stirred at room temperature for 12 hours.

After the temperature reached 3° C. by cooling at 3° C., the tetrahydrofuran solution was added dropwise during 10 minutes. After the dropwise addition, the temperature was increased to room temperature with stirring and then stirring was continued for 2 hours at room temperature. After the termination of stirring, 50 g of diisopropyl ether and 50 g of pure water were added and stirred for 30 minutes, followed by separation into two phases. Then, a water phase was removed and an organic phase was rinsed with 50 g of distilled water three times, followed by drying the organic phase by 10 g of magnesium sulfate. Thereafter magnesium sulfate was filtered out and reduced-pressure condensation was conducted at 150° C. and 0.1 mmHg, thereby obtaining 11.5 g of a siloxane compound (A-1) represented by the following formula in the form of a colorless transparent viscous substance at a yield of 82 mass %. The ratio between X1 and X2 was X1:X2=4:4 in terms of the average number of them. As a result of measuring the viscosity, it was confirmed that the siloxane compound (A-1) had a viscosity of 900 mPa·S.

Siloxane Compound (A-1)

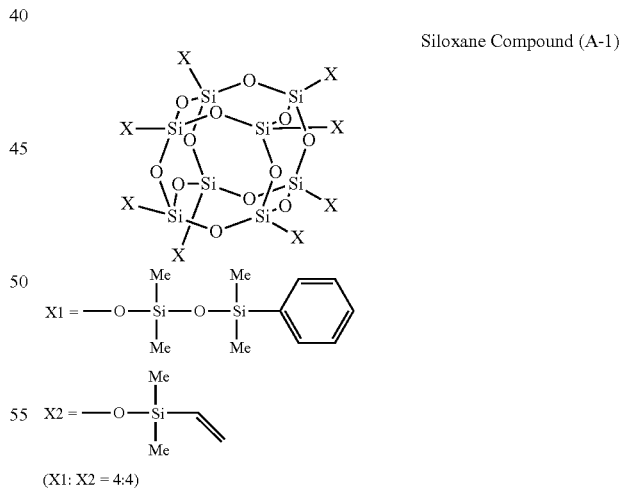

(X1: X2 = 4:4)

<Result of NMR Measurement>
$^1$H NMR (Solvent: Deuterated chloroform, Standard substance: Tetramethylsilane); δ=−0.04-0.47 (m, 72H) 5.66-6.24 (m, 12H), 7.21-7.45 (m, 12H), 7.47-7.69 (m, 8H)

3-2. Silylated Precursor (S-2)→Siloxane Compound (A-9)

Operations were performed under the same procedure as in the reaction for obtaining the above-mentioned siloxane compound (A-1) with the exception that 11.5 g (10.0 mmol) of the silylated precursor (S-2) was used and that 5.49 g (30.0 mmol) of 4-bromobenzocyclobutene was used in place of 4-bromobenzene, thereby obtaining 12.2 g of a siloxane compound (A-9) represented by the following formula in the form of a colorless transparent oil at a yield of 80 mass %. The ratio between X1 and X2 was X1:X2=3:5 in terms of the average number of them. As a result of measuring the viscosity, it was confirmed that the viscosity was 800 mPa·S.

Siloxane Compound (A-9)

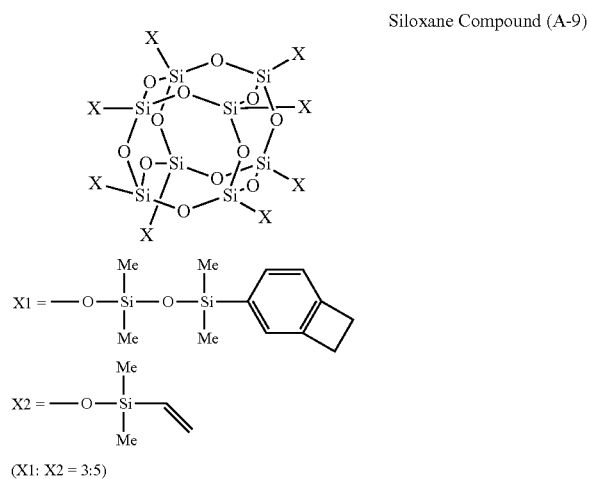

(X1: X2 = 3:5)

<Result of NMR Measurement>

$^1$H NMR (Solvent: Deuterated chloroform, Standard substance: Tetramethylsilane); δ=0.05-0.07 (m, 18H), 0.13-0.15 (m, 30H), 0.28-0.31 (m, 18H), 3.15 (s, 12H), 5.75-5.78 (m, 5H), 5.88-5.93 (m, 5H), 6.04-6.07 (m, 5H) 7.01-7.03 (m, 3H), 7.20-7.22 (m, 3H), 7.36-7.38 (m, 3H)

$^{29}$Si NMR (Solvent: Deuterated chloroform, Standard substance: Tetramethylsilane); δ=−0.7, −1.0, −17.7, −109.0, −110.0

3-3. Silylated Precursor (S-1)→Siloxane Compound (A-10)

Operations were performed under the same procedure as in the reaction for obtaining the above-mentioned siloxane compound (A-1) with the exception that 11.2 g (10.0 mmol) of the silylated precursor (S-1) was used and that 5.22 g (40.0 mmol) of 4-fluorobromobenzene was used in place of 4-bromobenzene, thereby obtaining 8.07 g of a siloxane compound (A-10) represented by the following formula in the form of a colorless transparent oil at a yield of 45 mass %. The ratio between X1 and X2 was X1:X2=4:4 in terms of the average number of them. As a result of measuring the viscosity, it was confirmed that the viscosity was 100 mPa·S.

Siloxane Compound (A-10)

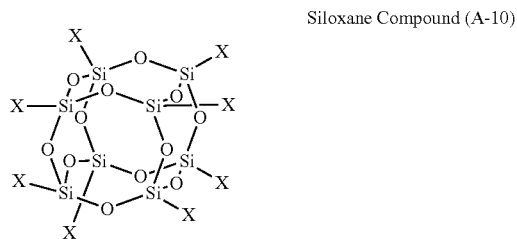

-continued

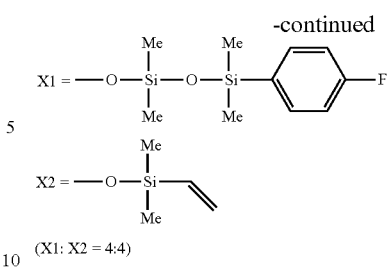

(X1: X2 = 4:4)

<Result of NMR Measurement>

$^1$H NMR (Solvent: Deuterated chloroform, Standard substance: Tetramethylsilane); δ=0.07-0.35 (m, 72H), 5.75-6.08 (m, 12H), 7.03 (brs, 8H), 7.50 (brs, 8H)

$^{19}$F NMR (Solvent: Deuterated chloroform, Standard substance: Trichlorofluoromethane); δ=−112.2

3-4. Silylated Precursor (S-1)→Siloxane Compound (A-11)

Operations were performed under the same procedure as in the reaction for obtaining the above-mentioned siloxane compound (A-1) with the exception that 11.2 g (10.0 mmol) of the silylated precursor (S-1) was used and that 9.00 g (40.0 mmol) of 4-bromobenzotrifluoride was used in place of 4-bromobenzene, thereby obtaining 8.55 g of a siloxane compound (A-11) represented by the following formula in the form of a colorless transparent viscous substance at a yield of 43 mass %. The ratio between X1 and X2 was X1:X2=4:4 in terms of the average number of them. As a result of measuring the viscosity, it was confirmed that the viscosity was 1100 mPa·S.

Siloxane Compound (A-11)

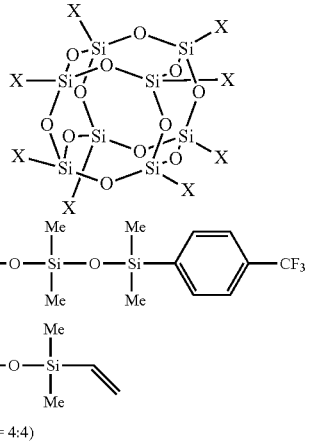

(X1: X2 = 4:4)

<Result of NMR Measurement>

$^1$H NMR (Solvent: Deuterated chloroform, Standard substance: Tetramethylsilane); δ=−0.06-0.37 (m, 72H), 5.72-6.14 (m, 12H), 7.57-7.66 (m, 16H)

$^{29}$Si NMR (Solvent: Deuterated chloroform, Standard substance: Tetramethylsilane); δ=0.93-1.70, −17.1, −109.3, −110.1

$^{19}$F NMR (Solvent: Deuterated chloroform, Standard substance: Trichlorofluoromethane); δ=−63.3

3-5. Silylated Precursor (S-1)→Siloxane Compound (A-12)

Operations were performed under the same procedure as in the reaction for obtaining the above-mentioned siloxane compound (A-1) with the exception that 11.2 g (10.0 mmol) of the silylated precursor (S-1) was used and that 9.00 g (40.0 mmol) of 3-bromobenzotrifluoride was used in place of 4-bromobenzene, thereby obtaining 7.06 g of a siloxane compound (A-12) represented by the following formula in the form of a colorless transparent viscous substance at a yield of 35 mass %. The ratio between X1 and X2 was X1:X2=4:4 in terms of the average number of them. As a result of measuring the viscosity, it was confirmed that the viscosity was 1100 mPa·S.

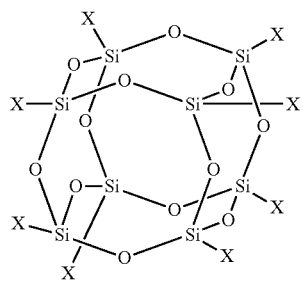

Siloxane Compound (A-12)

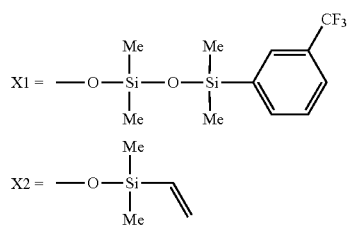

(X1:X2 = 4:4)

<Result of NMR Measurement>

$^1$H NMR (Solvent: Deuterated chloroform, Standard substance: Tetramethylsilane); δ=0.07-0.40 (m, 72H), 5.73-6.12 (m, 12H), 7.46 (m, 4H), 7.60 (m, 4H), 7.76 (m, 8H)

$^{29}$Si NMR (Solvent: Deuterated chloroform, Standard substance: Tetramethylsilane); δ=0.7, −1.6, −17.2, −109.3, −110.2

$^{19}$F NMR (Solvent: Deuterated chloroform, Standard substance: Trichlorofluoromethane); δ=−63.1

3-6. Silylated Precursor (S-1)→Siloxane Compound (A-13)

Operations were performed under the same procedure as in the reaction for obtaining the above-mentioned siloxane compound (A-1) with the exception that 11.2 g (10.0 mmol) of the silylated precursor (S-1) was used and that 11.72 g (40.0 mmol) of 3,5-bis(trifluoromethyl)bromobenzene was used in place of 4-bromobenzene, thereby obtaining 16.1 g of a siloxane compound (A-13) represented by the following formula in the form of a colorless transparent viscous substance at a yield of 83 mass %. The ratio between X1 and X2 was X1:X2=4:4 in terms of the average number of them. As a result of measuring the viscosity, it was confirmed that the viscosity was 1000 mPa·S.

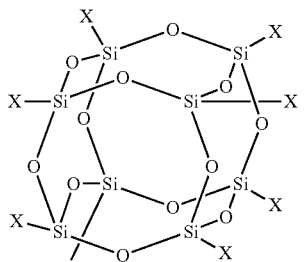

Siloxane Compound (A-13)

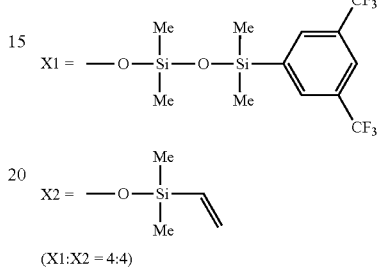

(X1:X2 = 4:4)

<Result of NMR Measurement>

$^1$H NMR (Solvent: Deuterated chloroform, Standard substance: Tetramethylsilane); δ=−0.06-0.05 (m, 72H), 5.58-6.21 (m, 12H), 7.77-8.02 (m, 12H)

$^{29}$Si NMR (Solvent: Deuterated chloroform, Standard substance: Tetramethylsilane); δ=8.4, −1.6, −16.4, −109.2, −110.0

$^{19}$F NMR (Solvent: Deuterated chloroform, Standard substance: Trichlorofluoromethane); −63.3

3-7. Silylated Precursor (S-1)→Siloxane Compound (A-14)

Operations were performed under the same procedure as in the reaction for obtaining the above-mentioned siloxane compound (A-1) with the exception that 11.2 g (10.0 mmol) of the silylated precursor (S-1) was used and that 9.00 g (40.0 mmol) of 3-trifluoromethylbromobenzene was used in place of 4-bromobenzene and that the amount of hexamethylcyclotrisiloxane was modified into 9.8 g (44 mmol), thereby obtaining 18.7 g of a siloxane compound (A-14) represented by the following formula in the form of a colorless transparent viscous substance at a yield of 75 mass %. The ratio between X1 and X2 was X1:X2=4:4 in terms of the average number of them. As a result of measuring the viscosity, it was confirmed that the viscosity was 3100 mPa·S.

Siloxane Compound (A-14)

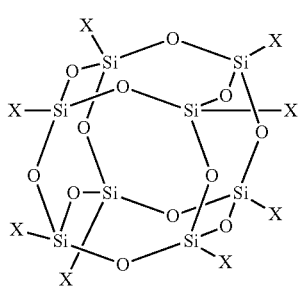

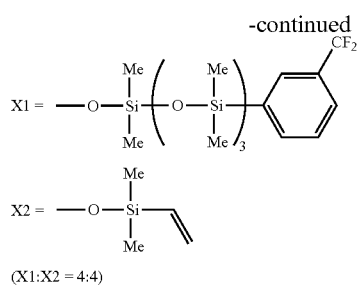

(X1:X2 = 4:4)

3-8. Silylated Precursor (S-3)→Siloxane Compound (A-15)

Operations were performed under the same procedure as in the reaction for obtaining the above-mentioned siloxane compound (A-1) with the exception that 17.3 g (10.0 mmol) of the silylated precursor (S-3) was used and that the amount of trichloroisocyanuric acid was modified into 2.79 g (18.3 mmol) and that 13.99 g (60.0 mmol) of 4-bromobiphenyl was used in place of 4-bromobenzene, thereby obtaining 25.2 g of a siloxane compound (A-15) represented by the following formula in the form of a colorless transparent viscous substance at a yield of 70 mass %. The ratio between X1 and X2 was X1:X2=5:3 in terms of the average number of them. As a result of measuring the viscosity, it was confirmed that the viscosity was 3800 mPa·S.

Siloxane Compound (A-15)

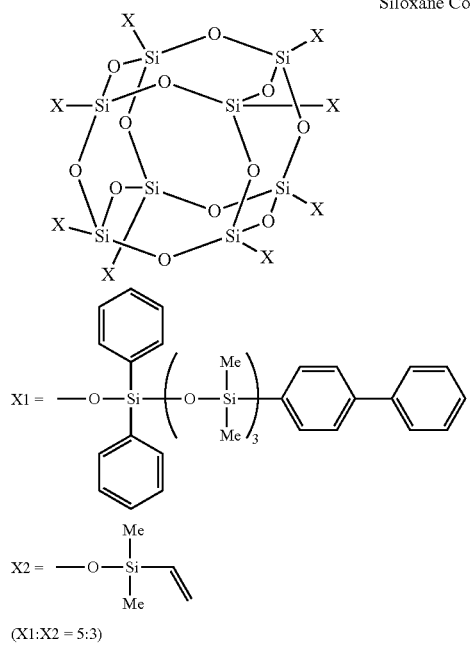

(X1:X2 = 5:3)

A siloxane compound (A-16) was synthesized in a manner as discussed below. More specifically, there was employed a method of reacting a commercially available trimethylsilanol with an organic metal reagent such as n-butyllithium and the like to prepare a siloxylithium compound and reacting the siloxylithium compound with a chlorinated precursor.

3-9. Silylated Precursor (S-1)→Siloxane Compound (A-16)

A 300 mL three-neck flask having a thermometer and a reflux condenser was charged with 50.0 g of tetrahydrofuran and 11.2 g (10.0 mmol) of the silylated precursor (S-1) and then cooled to −78° C. with stirring. After the inner temperature reached −78° C., 3.41 g (15.0 mmol) of trichloroisocyanuric acid was added thereto. After the addition, the contents were stirred for 30 minutes at −78° C. and then increased in temperature to room temperature with stirring. A precipitated insoluble substance was filtered out thereby obtaining a tetrahydrofuran solution.

Thereafter, a 1 L three-neck flask having a thermometer and a reflux condenser was charged with 3.6 g (40.0 mmol) of trimethylsilanol and 50 g of diethyl ether and then cooled to −78° C. with stirring. After the inner temperature reached −78° C., 25 mL (40 mmol) of a 1.6 mol/L butyllithiumhexane solution was added dropwise thereto during 30 minutes.

Then, the tetrahydrofuran solution was added thereto dropwise during 10 minutes. After the dropwise addition, the temperature was increased to room temperature with stirring and then stirring was continued for 2 hours at room temperature. After the termination of stirring, 50 g of diisopropyl ether and 50 g of pure water were added and stirred for 30 minutes, followed by separation into two phases. Then, a water phase was removed and an organic phase was rinsed with 50 g of distilled water three times, followed by drying the organic phase by 10 g of magnesium sulfate. Thereafter magnesium sulfate was filtered out and reduced-pressure condensation was conducted at 150° C. and 0.1 mmHg, thereby obtaining 6.90 g of a siloxane compound (A-16) represented by the following formula in the form of a colorless transparent viscous substance at a yield of 47%. The ratio between X1 and X2 was X1:X2=4:4 in terms of the average number of them. As a result of measuring the viscosity, it was confirmed that the siloxane compound (A-1) had a viscosity of 900 mPa·S.

Siloxane Compound (A-16)

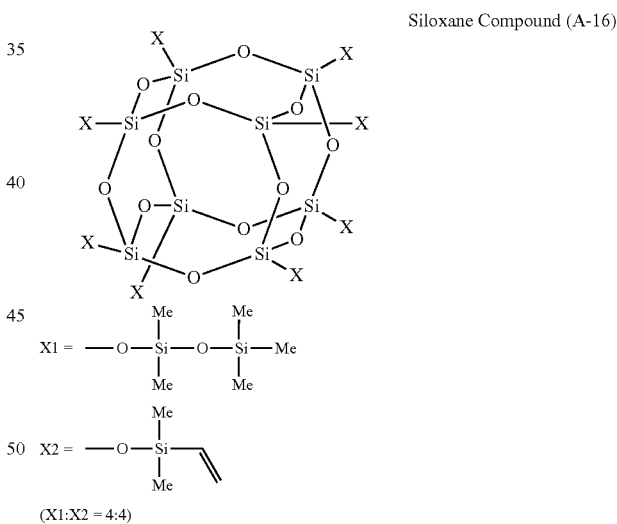

(X1:X2 = 4:4)

<Result of NMR Measurement>

$^1$H NMR (Solvent: Deuterated chloroform, Standard substance: Tetramethylsilane); δ=0.09 (brs, 60H), 0.20 (brs, 24H), 5.76-6.16 (m, 12H)

$^{29}$Si NMR (Solvent: Deuterated chloroform, Standard substance: Tetramethylsilane); δ=15.5, 7.7, −11.2, −101.9, −103.0

3-10. Silylated Precursor (S-1)→Siloxane Compound (A-17)

In the same manner as in the example of synthesis of (A-16), operations were performed with the exception that 5.29 g (40.0 mmol) of t-butyldimethylsilanol was used in place of trimethylsilanol, thereby obtaining 7.66 g of a siloxane compound (A-17) represented by the following formula in the form of a colorless transparent oil at a yield of 44%. The ratio between X1 and X2 was X1:X2=4:4 in terms of the average number of them. As a result of measuring the viscosity, it was confirmed that the viscosity was 900 mPa·S.

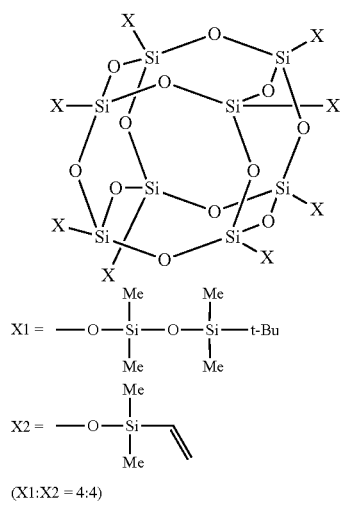

Siloxane Compound (A-17)

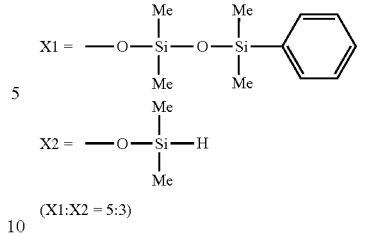

(X1:X2 = 5:3)

<Result of NMR Measurement>

$^1$H NMR (Solvent: Deuterated chloroform, Standard substance: Tetramethylsilane); δ=0.04-0.21 (m, 72H), 0.86 (s, 36H), 5.75-6.16 (m, 12H)

$^{29}$Si NMR (Solvent: Deuterated chloroform, Standard substance: Tetramethylsilane); δ=11.0, 0.3, −19.2, −109.2, −110.3

3-11. Silylated Precursor (S-4)→Siloxane Compound (A-18)

Operations were performed under the same procedure as in the reaction for obtaining the above-mentioned siloxane compound (A-1) with the exception that 11.2 g (10.0 mmol) of the silylated precursor (S-4) was used and that the amount of trichloroisocyanuric acid was modified into 2.79 g (18.3 mmol), thereby obtaining 11.3 g of a siloxane compound (A-18) represented by the following formula in the form of a colorless transparent viscous substance at a yield of 82 mass %. The ratio between X1 and X2 was X1:X2=5:3 in terms of the average number of them. As a result of measuring the viscosity, it was confirmed that the viscosity was 800 mPa·S.

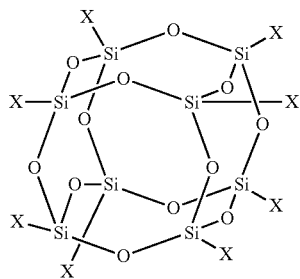

Siloxane Compound (A-18)

3-12. Silylated Precursor (S-4)→Siloxane Compound (A-19)

Operations were performed under the same procedure as in Example 1 with the exception that 10.2 g (10.0 mmol) of the silylated precursor (S-4) was used and that 3.74 g (44.0 mmol) of 4-bromobenzocyclobutene was used in place of 4-bromobenzene, thereby obtaining 10.5 g of a siloxane compound (A-19) represented by the following formula in the form of a colorless transparent viscous substance at a yield of 70 mass %. The ratio between X1 and X2 was X1:X2=4:4 in terms of the average number of them. As a result of measuring the viscosity, it was confirmed that the viscosity was 1200 mPa·S.

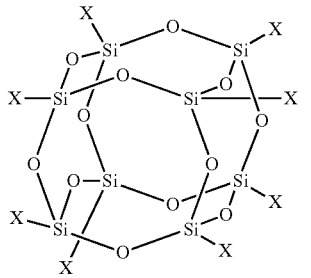

Siloxane Compound (A-19)

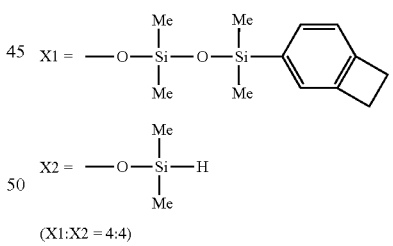

(X1:X2 = 4:4)

3-13. Silylated Precursor (S-4)→Siloxane Compound (A-20)

Operations were performed under the same procedure as in Example 1 with the exception that 11.2 g (10.0 mmol) of the silylated precursor (S-4) was used and that 5.22 g (40.0 mmol) of 4-fluorobromobenzene was used in place of 4-bromobenzene, thereby obtaining 13.5 g of a siloxane compound (A-20) represented by the following formula in the form of a colorless transparent viscous substance at a yield of 80 mass %. The ratio between X1 and X2 was X1:X2=4:4 in terms of the average number of them. As a result of measuring the viscosity, it was confirmed that the viscosity was 800 mPa·S.

Siloxane Compound (A-20)

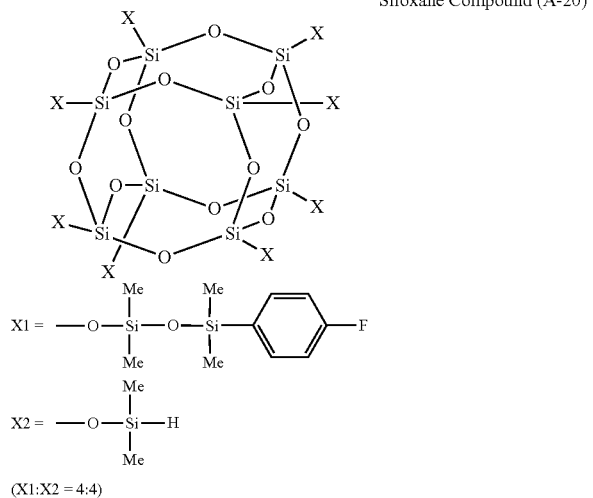

3-14. Silylated Precursor (S-4)→Siloxane Compound (A-21)

Operations were performed under the same procedure as in Example 1 with the exception that 11.2 g (10.0 mmol) of the silylated precursor (S-4) was used and that 9.00 g (40.0 mmol) of 4-bromobenzotrifluoride was used in place of 4-bromobenzene, thereby obtaining 16.1 g of a siloxane compound (A-21) represented by the following formula in the form of a colorless transparent viscous substance at a yield of 85 mass %. The ratio between X1 and X2 was X1:X2=4:4 in terms of the average number of them. As a result of measuring the viscosity, it was confirmed that the viscosity was 800 mPa·S.

Siloxane Compound (A-21)

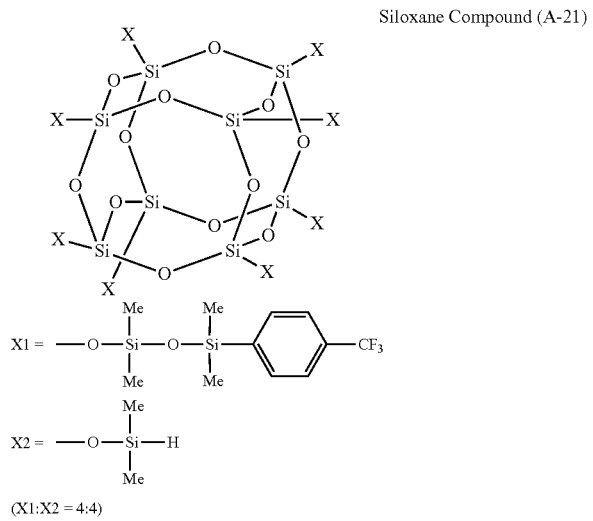

3-15. Silylated Precursor (S-4)→Siloxane Compound (A-22)

Operations were performed under the same procedure as in Example 1 with the exception that 11.2 g (10.0 mmol) of the silylated precursor (S-4) was used and that 9.00 g (40.0 mmol) of 4-bromobenzotrifluoride was used in place of 4-bromobenzene, thereby obtaining 15.9 g of a siloxane compound (A-22) represented by the following formula in the form of a colorless transparent viscous substance at a yield of 84 mass %. The ratio between X1 and X2 was X1:X2=4:4 in terms of the average number of them. As a result of measuring the viscosity, it was confirmed that the viscosity was 800 mPa·S.

Siloxane Compound (A-22)

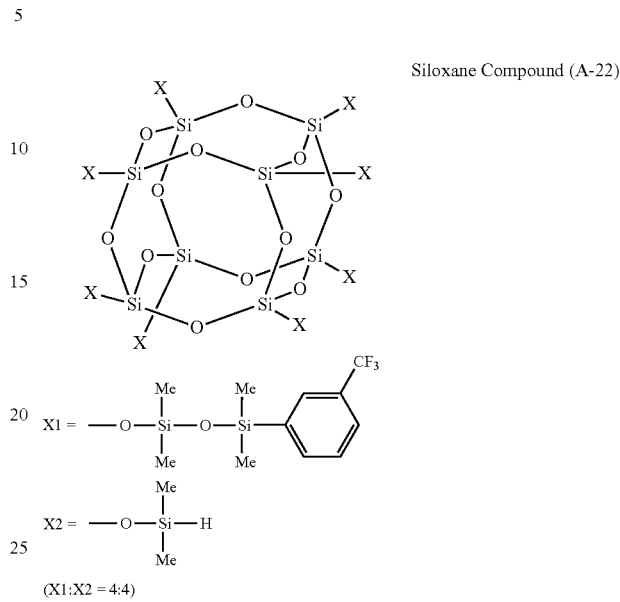

3-16. Silylated Precursor (S-4)→Siloxane Compound (A-23)

Operations were performed under the same procedure as in Example 1 with the exception that 10.2 g (10.0 mmol) of the silylated precursor (S-4) was used and that 12.9 g (44.0 mmol) of 3,5-bis(trifluoromethyl)bromobenzene was used in place of 4-bromobenzene, thereby obtaining 13.2 g of a siloxane compound (A-23) represented by the following formula in the form of a colorless transparent viscous substance at a yield of 72 mass %. The ratio between X1 and X2 was X1:X2=4:4 in terms of the average number of them. As a result of measuring the viscosity, it was confirmed that the viscosity was 900 mPa·S.

Siloxane Compound (A-23)

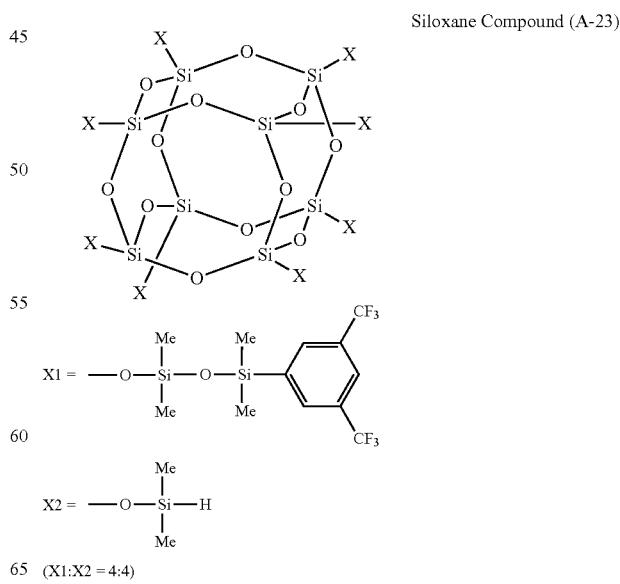

3-17. Silylated Precursor (S-4)→Siloxane Compound (A-24)

Operations were performed under the same procedure as in Example 1 with the exception that 10.2 g (10.0 mmol) of the silylated precursor (S-4) was used and that the amount of trichloroisocyanuric acid was modified into 2.50 g (11.0 mmol) and that the amount of hexamethylcyclotrisiloxane was modified into 9.8 g (44 mmol) and that 7.42 g (33.0 mmol) of 3-trifluoromethylbromobenzene was used in place of 4-bromobenzene, thereby obtaining 14.9 g of a siloxane compound (A-24) represented by the following formula in the form of a colorless transparent viscous substance at a yield of 74 mass %. The ratio between X1 and X2 was X1:X2=3:5 in terms of the average number of them. As a result of measuring the viscosity, it was confirmed that the viscosity was 2300 mPa·S.

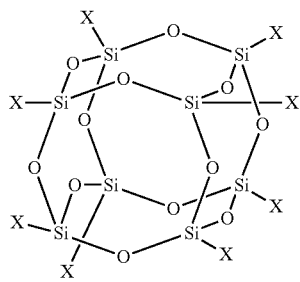

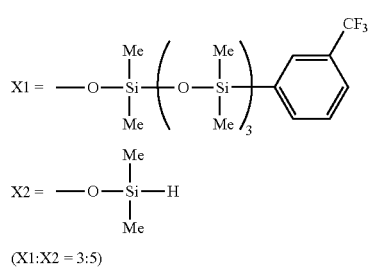

(X1:X2 = 3:5)

3-18. Silylated Precursor (S-4)→Siloxane Compound (A-25)

Operations were performed under the same procedure as in the reaction for obtaining the above-mentioned siloxane compound (A-1) with the exception that 10.2 g (10.0 mmol) of the silylated precursor (S-4) was used and that the amount of trichloroisocyanuric acid was modified into 1.67 g (7.3 mmol) and that the amount of hexamethylcyclotrisiloxane was modified into 4.9 g (22 mmol) and that 5.13 g (22.0 mmol) of 4-bromobiphenyl was used in place of 4-bromobenzene, thereby obtaining 22.1 g of a siloxane compound (A-25) represented by the following formula in the form of a colorless transparent viscous substance at a yield of 70 mass %. The ratio between X1 and X2 was X1:X2=2:6 in terms of the average number of them. As a result of measuring the viscosity, it was confirmed that the viscosity was 3900 mPa·S.

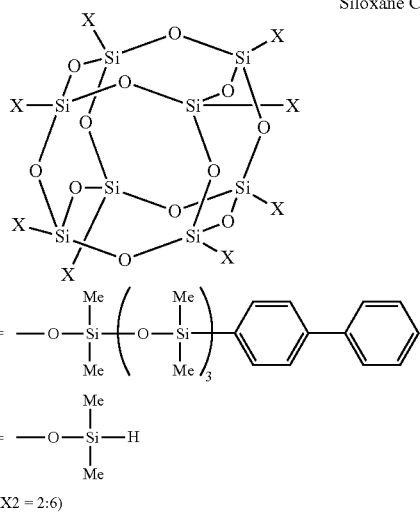

(X1:X2 = 2:6)

3-19. Silylated Precursor (S-4)→Siloxane Compound (A-26)

Operations were performed under the same procedure as in the example of synthesis of (A-16) with the exception that 10.2 g (10.0 mmol) of the silylated precursor (S-4) was used, thereby obtaining 11.0 g of a siloxane compound (A-26) represented by the following formula in the form of a colorless transparent viscous substance at a yield of 80 mass %. The ratio between X1 and X2 was X1:X2=4:4 in terms of the average number of them. As a result of measuring the viscosity, it was confirmed that the viscosity was 1200 mPa·S.

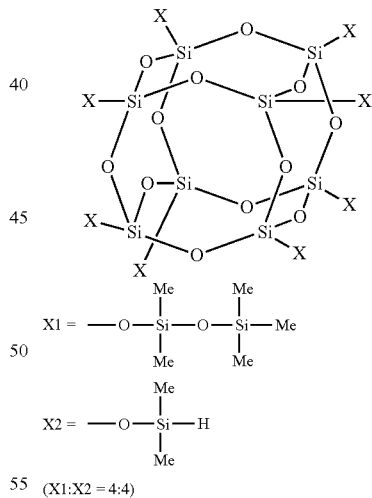

(X1:X2 = 4:4)

3-20. Silylated Precursor (S-4)→Siloxane Compound (A-27)

Operations were performed under the same procedure as in the example of synthesis of (A-16) with the exception that 10.2 g (10.0 mmol) of the silylated precursor (S-4) was used and that 5.29 g (40.0 mmol) of t-butyldimethylsilanol was used in place of trimethylsilanol, thereby obtaining 12.6 g of a siloxane compound (A-27) represented by the following formula in the form of a colorless transparent viscous substance at a yield of 82 mass %. The ratio between X1 and X2 was X1:X2=4:4 in terms of the average number of them. As a result of measuring the viscosity, it was confirmed that the viscosity was 1200 mPa·S.

Siloxane Compound (A-27)

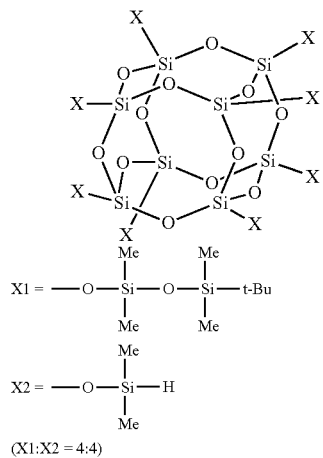

(X1:X2 = 4:4)

3-21. Silylated Precursor (S-5)→Siloxane Compound (A-28)

Operations were performed under the same procedure as in the reaction for obtaining the above-mentioned siloxane compound (A-1) with the exception that 20.8 g (10.0 mmol) of the silylated precursor (S-5) was used in place of the silylated precursor (S-1) and that the amount of trichloroisocyanuric acid was modified into 1.67 g (7.3 mmol) and that the amount of hexamethylcyclotrisiloxane was modified into 4.9 g (22 mmol) and that the amount of 4-bromobenzene was modified into 3.2 g (20.0 mmol), thereby obtaining 15.8 g of a siloxane compound (A-28) represented by the following formula in the form of a colorless transparent viscous substance at a yield of 71 mass %. The ratio between X1 and X2 was X1:X2=6:2 in terms of the average number of them. As a result of measuring the viscosity, it was confirmed that the viscosity was 3500 mPa·S.

Siloxane Compound (A-28)

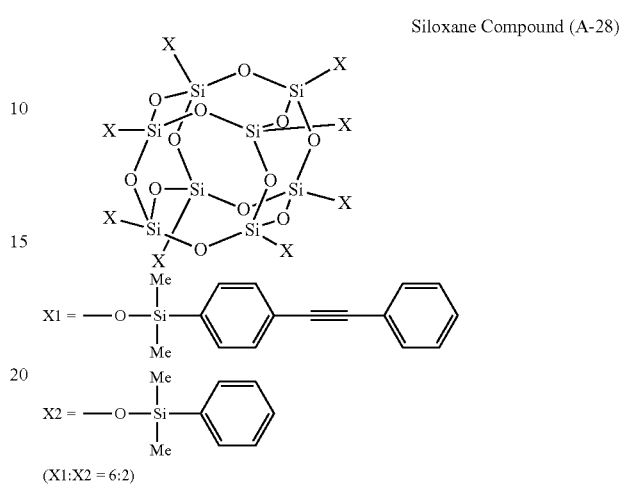

(X1:X2 = 6:2)

[Production of Cured Product, and Transparency/Heat Resistance Evaluation]

Compositions obtained by adding a platinum compound 1 or 2 to the synthesized siloxane compounds (A-1) and (A-9) to (A-28), and another compositions obtained by adding siloxane compounds (B-1) to (B-5) or siloxane compounds (C-1) to (C-4) to the above-mentioned compositions were prepared. These compositions were cured by heat thereby obtaining cured products.

The platinum compounds 1 and 2, the siloxane compounds (B-1) to (B-5) and the siloxane compounds (C-1) to (C-4) will be explained by Table 2.

TABLE 2

| | |
|---|---|
| Platinum Compound 1 | Xylene solution of platinum(0)-1,3-divinyl-1,1,3,3-tetramethyldisiloxane complex |
| Platinum Compound 2 | Platinic chloride hexahydrate |
| Siloxane Compound (B-1) | 1,4-Bis(dimethylsilyl)benzene |
| Siloxane Compound (B-2) | 1,1,3,3-Tetramethyldisiloxane |
| Siloxane Compound (B-3) | 1,1,3,3-Tetramethyldivinyldisiloxane |
| Siloxane Compound (B-4) | Si—H-modified silicone available from Gelest, Inc. (U.S.A) under the trade name of HMS-991 |
| Siloxane Compound (B-5) | Si-vinyl-modified silicone available from Gelest, Inc. (U.S.A) under the trade name of VDT-123 |
| Siloxane Compound (C-1) | 1,3,5,7-Tetramethylcyclotetrasiloxane |
| Siloxane Compound (C-2) | 1,3,5,7-Tetravinyl-1,3,5,7-tetramethylcyclotetrasiloxane |
| Siloxane Compound (C-3) | Methylhydrocyclosiloxane ((MeHSiO)$_{3-5}$) |
| Siloxane Compound (C-4) | Phenylhydrocyclosiloxane ((PhHSiO)$_{3-5}$) |
| Platinum Compound 1 | Xylene solution of platinum(0)-1,3-divinyl-1,1,3,3-tetramethyldisiloxane complex |
| Platinum Compound 2 | Platinic chloride hexahydrate |
| Siloxane Compound (B-1) | 1,4-Bis(dimethylsilyl)benzene |
| Siloxane Compound (B-2) | 1,1,3,3-Tetramethyldisiloxane |
| Siloxane Compound (B-3) | 1,1,3,3-Tetramethyldivinyldisiloxane |
| Siloxane Compound (B-4) | Si—H-modified silicone available from Gelest, Inc. (U.S.A) under the trade name of HMS-991 |

TABLE 2-continued

| | |
|---|---|
| Siloxane Compound (B-5) | Si-vinyl-modified silicone available from Gelest, Inc. (U.S.A) under the trade name of VDT-123 |
| Siloxane Compound (C-1) | 1,3,5,7-Tetramethylcyclotetrasiloxane |
| Siloxane Compound (C-2) | 1,3,5,7-Tetravinyl-1,3,5,7-tetramethylcyclotetrasiloxane |
| Siloxane Compound (C-3) | Methylhydrocyclosiloxane ((MeHSiO)$_{3-5}$) |
| Siloxane Compound (C-4) | Phenylhydrocyclosiloxane ((PhHSiO)$_{3-5}$) |

Then, preparations of these compositions (Examples 1 to 44) will be shown by Table 3.

TABLE 3

| | Composition | Siloxane Compound (A) | Siloxane Compound (B) | Siloxane Compound (C) | Platinum Compound |
|---|---|---|---|---|---|
| Example 1 | 1-1 | A-1 (100), A-18 (132) | — | — | 1 (20 ppm) |
| Example 2 | 1-2 | A-9 (100), A-19 (100) | — | — | 1 (20 ppm) |
| Example 3 | 1-3 | A-10 (100), A-20 (100) | — | — | 1 (20 ppm) |
| Example 4 | 1-4 | A-11 (100), A-21 (100) | — | — | 1 (20 ppm) |
| Example 5 | 1-5 | A-12 (100), A-22 (100) | — | — | 1 (20 ppm) |
| Example 6 | 1-6 | A-13 (100), A-23 (100) | — | — | 1 (20 ppm) |
| Example 7 | 1-7 | A-14 (100), A-24 (100) | — | — | 1 (20 ppm) |
| Example 8 | 1-8 | A-15 (100), A-25 (100) | — | — | 1 (20 ppm) |
| Example 9 | 1-9 | A-16 (100), A-26 (100) | — | — | 1 (20 ppm) |
| Example 10 | 1-10 | A-17 (100), A-27 (100) | — | — | 1 (20 ppm) |
| Example 11 | 2-1 | A-9 (100) | B-1 (5) | — | 1 (20 ppm) |
| Example 12 | 2-2 | A-13 (100) | B-2 (10) | — | 1 (20 ppm) |
| Example 13 | 2-3 | A-15 (100) | B-4 (5) | — | 1 (50 ppm) |
| Example 14 | 2-4 | A-19 (100) | B-5 (10) | — | 1 (100 ppm) |
| Example 15 | 2-5 | A-23 (100) | B-3 (5) | — | 1 (100 ppm) |
| Example 16 | 2-6 | A-24 (100) | B-5 (5) | — | 1 (100 ppm) |
| Example 17 | 2-7 | A-19 (100) | B-3 (5) + B-5 (10) | — | 2 (100 ppm) |
| Example 18 | 2-8 | A-21 (100) | B-5 (10) | — | 1 (20 ppm) |
| Example 19 | 2-9 | A-22 (100) | B-5 (10) | — | 1 (20 ppm) |
| Example 20 | 3-1 | A-1 (100) | B-5 (5) | C-4 (10) | 2 (20 ppm) |
| Example 21 | 3-2 | A-9 (100) | B-2 (5) | C-1 (20) | 2 (20 ppm) |
| Example 22 | 3-3 | A-13 (100) | B-4 (10) | C-3 (15) | 2 (20 ppm) |
| Example 23 | 3-4 | A-14 (100) | B-1 (10) | C-2 (20) | 2 (50 ppm) |
| Example 24 | 3-5 | A-15 (100) | B-3 (10) | C-3 (5) | 2 (50 ppm) |
| Example 25 | 3-6 | A-18 (100) | B-5 (5) | C-2 (20) | 2 (50 ppm) |
| Example 26 | 3-7 | A-23 (100) | B-5 (10) | C-2 (20) | 2 (100 ppm) |
| Example 27 | 3-8 | A-24 (100) | B-3 (10) + B-5 (5) | C-2 (15) | 2 (100 ppm) |
| Example 28 | 3-9 | A-25 (100) | B-5 (10) | C-2 (20) | 2 (150 ppm) |
| Example 29 | 3-10 | A-28 (100) | B-4 (5) | C-4 (20) | 2 (150 ppm) |
| Example 30 | 3-11 | A-11 (100) | B-1 (5) | C-1 (15) | 1 (20 ppm) |
| Example 31 | 3-12 | A-12 (100) | B-2 (5) | C-3 (20) | 1 (20 ppm) |
| Example 32 | 3-13 | A-17 (100) | B-2 (5) | C-1 (15) | 1 (20 ppm) |
| Example 33 | 3-14 | A-26 (100) | B-3 (10) | C-2 (10) | 1 (20 ppm) |
| Example 34 | 3-15 | A-27 (100) | B-3 (10) | C-2 (10) | 1 (20 ppm) |
| Example 35 | 4-1 | A-1 (100) | — | C-1 (10) | 1 (20 ppm) |
| Example 36 | 4-2 | A-14 (100) | — | C-4 (20) | 1 (50 ppm) |
| Example 37 | 4-3 | A-18 (100) | — | C-2 (10) | 1 (50 ppm) |
| Example 38 | 4-4 | A-25 (100) | — | C-2 (20) | 1 (150 ppm) |
| Example 39 | 4-5 | A-28 (100) | — | C-3 (10) | 1 (150 ppm) |
| Example 40 | 4-6 | A-10 (100) | — | C-1 (10) + C-4 (5) | 1 (20 ppm) |

TABLE 3-continued

| | Composition | Siloxane Compound (A) | Siloxane Compound (B) | Siloxane Compound (C) | Platinum Compound |
|---|---|---|---|---|---|
| Example 41 | 4-7 | A-11 (100) | — | C-1 (15) | 1 (20 ppm) |
| Example 42 | 4-8 | A-12 (100) | — | C-1 (10) + C-4 (5) | 1 (20 ppm) |
| Example 43 | 4-9 | A-16 (100) | — | C-1 (15) | 1 (20 ppm) |
| Example 44 | 4-10 | A-20 (100) | — | C-2 (10) | 1 (20 ppm) |

Note:
Parenthesized values represent parts by mass.

As shown in Table 3, compositions (1-1) to (1-10) were compositions formed from a siloxane compound (A) and a platinum compound. Compositions (2-1) to (2-9) were compositions formed from a siloxane compound (A), a siloxane compound (B) and a platinum compound. Compositions (3-1) to (3-15) were compositions formed from a siloxane compound (A), a siloxane compound (B), a siloxane compound (C) and a platinum compound. Compositions (4-1) to (4-10) were compositions formed from a siloxane compound (A), a siloxane compound (C) and a platinum compound. Incidentally, the compounding ratios were indicated in parentheses on parts by mass basis or on ppm basis.

Examples 1 to 44

Compositions prepared in accordance with Examples 1 to 44 of Table 3 were poured into a mold formed of silicone, commercially available from Shin-Etsu Chemical Co., Ltd. under the trade name of SH9555 at room temperature (20° C.). Compositions (2-1) and (3-2) were heated for 1 hour in a heating furnace of 150° C. and then heated for an additional 1 hour at 250° C. while the other compositions were heated in a heating furnace of 150° C. for 1 hour, with which cured products of Examples 1 to 44 were obtained. Any of these cured products had fluidity at room temperature and therefore these were easy to pour into the mold.

All of the thus obtained cured products of Examples 1 to 44 were confirmed to have no foaming, no cracks and no stickiness (or tackiness) unique to gel while having transparency, a good appearance and easiness in handling.

Thereafter, the compositions (1-1) to (1-10), (2-1) to (2-9), (3-1) to (3-15) and (4-1) to (4-10) as shown in Table 3 were applied onto a glass substrate. Then, the compositions (2-1) and (3-2) were heated for 1 hour in a heating furnace of 150° C. and further heated for an additional 1 hour at 250° C. while the other compositions were heated in a heating furnace of 150° C. for 1 hour, with which cured product films of Examples 1 to 44 were obtained.

The cured product films of Examples 1 to 44 were subjected to a transparency evaluation by using an ultraviolet and visible spectrophotometer, at both the time immediately after being formed and the time after being continuously heated at 140° C. for 1000 hours. As a result of measuring the light transmittance of the incident light of a wavelength of 450 nm, it was confirmed that the transmittance was 90% or greater in terms of 2.5 μm film thickness at both the time immediately after forming the film and the time after continuously heating the film at 140° C. for 1000 hours. Additionally, degradation of transparency due to the continuous heating was not observed. Furthermore, neither foaming nor cracks was confirmed.

Comparative Example 1

A thermosetting organic silicone resin of a no-solvent type or a two-pack type containing liquids A and B (which resin is produced by Shin-Etsu Chemical Co., Ltd. under the trade name of SCR-1011 (A/B) as a sealing material for a connection section of LED, a photodiode and an optical waveguide and for various kinds of solar cells) was applied onto a glass substrate, followed by heating it in a heating furnace of 150° C. for 1 hour, thereby obtaining a cured product on the glass substrate. This cured product film had a 90% or more light transmittance so as to be transparent immediately after being applied; however, after being continuously heated at 140° C. for 1000 hours, it turned yellow and lost the transparency.

Thus, it was confirmed that the cured product film formed by curing the composition of the present invention maintained its transparency and generated no foaming and cracks not only at the time immediately after being formed but also at the time after being continuously heated at 140° C. for 1000 hours, and it was confirmed that the film of the present invention was excellent in transparency and heat resistance. In the case of excluding the platinum compounds 1 and 2 from the composition, the composition remained viscous or had stickiness even after heating so that a cure product was not obtained.

The invention claimed is:

1. A composition comprising at least one kind of metal compound selected from the group consisting of a platinum compound, a palladium compound and a rhodium compound, and a siloxane compound (A) represented by general formula (1):

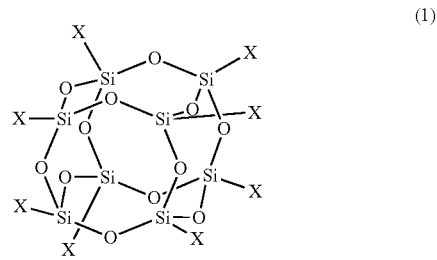

(1)

wherein X is mutually independently a group represented by general formula X1 or X2:

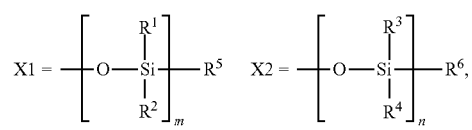

wherein the number of X1 (α) is an integer of 1-8;
the number of X2 (β) is an integer of 0-7;
the sum of α and β is 8;

$R^1$ to $R^4$ mutually independently represent a hydrogen atom, a $C_{1-8}$ alkyl group, alkenyl group, alkynyl group, or a $C_{6-8}$ aryl group, a hydrogen atom in these hydrocarbon groups being optionally substituted by a fluorine atom;

$R^5$ mutually independently represents a $C_{1-18}$ alkyl group, alkenyl group, alkynyl group or aryl group, a hydrogen atom in these hydrocarbon groups being optionally substituted by a fluorine atom, and a carbon atom being optionally substituted by an oxygen atom or a nitrogen atom;

$R^6$ mutually independently represents a hydrogen atom, a vinyl group or an allyl group;

m and n mutually independently represent an integer of 1-4; and $3 \leq m+n$.

2. A composition as claimed in claim 1, wherein $R^5$ is a methyl group, tertiary butyl group, phenyl group, biphenyl group, naphthyl group, a group represented by general formula (2):

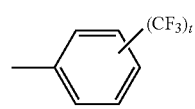

(2)

wherein t is an integer of 1-3, a group represented by general formula (3):

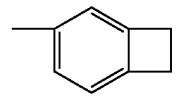

(3)

or a group represented by general formula (4):

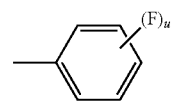

(4)

wherein u is an integer of 1-3.

3. A composition as claimed in claim 1, further comprising at least one kind of compound selected from the group consisting of a siloxane compound (B) represented by general formula (5):

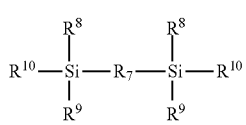

(5)

wherein $R^7$ is an ether bond, a phenylene group or a siloxane group represented by general formula (6):

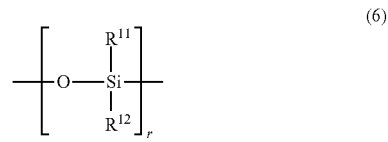

(6)

wherein $R^{11}$ and $R^{12}$ mutually independently represent a hydrogen atom, a $C_{1-8}$ alkyl group, alkenyl group, alkynyl group, or a $C_{6-8}$ aryl group, a hydrogen atom in these hydrocarbon groups optionally being substituted by a fluorine atom;

r is an integer of 1-100;

$R^8$ and $R^9$ mutually independently represent a hydrogen atom, a $C_{1-8}$ alkyl group, alkenyl group, alkynyl group, or a $C_{6-8}$ aryl group, a hydrogen atom in these hydrocarbon groups optionally being substituted by a fluorine atom; and $R^{10}$ is a hydrogen atom or a vinyl group, a siloxane compound (C) represented by general formula (7):

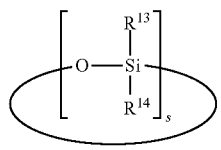

(7)

wherein $R^{13}$ mutually independently represents a hydrogen atom or a vinyl group;

$R^{14}$ mutually independently represents a hydrogen atom, a $C_{1-8}$ alkyl group or a $C_{6-8}$ aryl group, a hydrogen atom in these hydrocarbon groups optionally being substituted by a fluorine atom; and s is an integer of 3-7, and an epoxy compound.

4. A composition as claimed in claim 3, wherein the epoxy compound contains a glycidyl group, has a number average molecular weight of not lower than 60 and not higher than 10,000, and may contain a carbon-carbon double bond, a carbon-carbon triple bond, an aromatic ring or a heterocyclic ring, some or all of the hydrogen atoms in the organic group being mutually independently optionally substituted by a fluorine atom, a chlorine atom, an alkyl group or a fluoroalkyl group.

5. A cured product obtained by curing the composition as claimed in claim 1.

6. A cured product as claimed in claim 5, obtained by heating the composition to not lower than 100° C. and not higher than 300° C. to cure it.

7. A sealing material comprising the cured product as claimed in claim 5.

8. A siloxane compound represented by general formula (8):

(8)

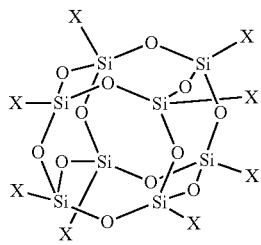

wherein X is mutually independently a group represented by general formula X1 or X2:

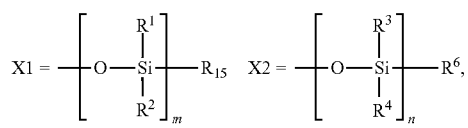

wherein the number of X1 ($\alpha$) is an integer of 1-8;
the number of X2 ($\beta$) is an integer of 0-7;
the sum of $\alpha$ and $\beta$ is 8;
$R^1$ to $R^4$ mutually independently represent a hydrogen atom, a $C_{1-8}$ alkyl group, alkenyl group; alkynyl group, or a $C_{6-8}$ aryl group, a hydrogen atom in these hydrocarbon groups being optionally substituted by a fluorine atom;
$R^{15}$ represents a $C_{1-18}$ alkyl group or aryl group, a hydrogen atom in these hydrocarbon groups being optionally substituted by a fluorine atom or a trifluoromethyl group;
$R^6$ mutually independently represents a hydrogen atom, a vinyl group or an allyl group;
m and n mutually independently represent an integer of 1-4; and $3 \leq m+n$.

9. A siloxane compound as claimed in claim 8, wherein $R^{15}$ is a methyl group, tertiary butyl group, phenyl group, biphenyl group, naphthyl group, a group represented by general formula (2):

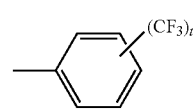

(2)

wherein t is an integer of 1-3,
a group represented by general formula (3):

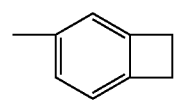

(3)

or a group represented by general formula (4):

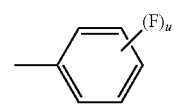

(4)

wherein u is an integer of 1-3.

* * * * *